US008853746B2

(12) United States Patent
Chen et al.

(10) Patent No.: US 8,853,746 B2
(45) Date of Patent: Oct. 7, 2014

(54) CMOS DEVICES WITH STRESSED CHANNEL REGIONS, AND METHODS FOR FABRICATING THE SAME

(75) Inventors: Xiangdong Chen, Poughquag, NY (US); Thomas W. Dyer, Pleasant Valley, NY (US); Kenneth Settlemyer, Bradenton, FL (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 1000 days.

(21) Appl. No.: 11/427,495

(22) Filed: Jun. 29, 2006

(65) Prior Publication Data

US 2008/0001182 A1    Jan. 3, 2008

(51) Int. Cl.
*H01L 29/76* (2006.01)
*H01L 27/148* (2006.01)
(Continued)

(52) U.S. Cl.
CPC ......... *H01L 29/7848* (2013.01); *H01L 21/7624* (2013.01); *H01L 21/823878* (2013.01); *H01L 29/66772* (2013.01); *H01L 29/66636* (2013.01); *H01L 29/165* (2013.01); *H01L 29/78684* (2013.01); *H01L 29/78* (2013.01); *H01L 27/1203* (2013.01); *H01L 21/84* (2013.01); *H01L 29/045* (2013.01); *H01L 21/823807* (2013.01); *H01L 29/1054* (2013.01); *H01L 29/78696* (2013.01)
USPC ............ 257/255; 257/627; 257/628; 257/69; 257/19; 257/288

(58) Field of Classification Search
USPC ............ 257/627, 628, 69, 19, 255, 288, 347
See application file for complete search history.

(56) References Cited

U.S. PATENT DOCUMENTS

| 3,602,841 A | 8/1971 | McGroddy |
| 4,665,415 A | 5/1987 | Esaki et al. |

(Continued)

FOREIGN PATENT DOCUMENTS

| CN | 1738056 A | 2/2006 |
| CN | 1797783 A | 7/2006 |

(Continued)

OTHER PUBLICATIONS

Kern Rim, et al., "Transconductance Enhancement in Deep Submicron Strained-Si n-MOSFETs". International Electron Devices Meeting, 26, 8, 1, IEEE, Sep. 1998.

(Continued)

*Primary Examiner* — Cathy N Lam
(74) *Attorney, Agent, or Firm* — Scully, Scott, Murphy & Presser, P.C.; Joseph P. Abate, Esq.

(57) ABSTRACT

The present invention relates to improved complementary metal-oxide-semiconductor (CMOS) devices with stressed channel regions. Specifically, each improved CMOS device comprises an field effect transistor (FET) having a channel region located in a semiconductor device structure, which has a top surface oriented along one of a first set of equivalent crystal planes and one or more additional surfaces oriented along a second, different set of equivalent crystal planes. Such additional surfaces can be readily formed by crystallographic etching. Further, one or more stressor layers with intrinsic compressive or tensile stress are located over the additional surfaces of the semiconductor device structure and are arranged and constructed to apply tensile or compressive stress to the channel region of the FET. Such stressor layers can be formed by pseudomorphic growth of a semiconductor material having a lattice constant different from the semiconductor device structure.

10 Claims, 17 Drawing Sheets

(51) Int. Cl.
*H01L 29/66* (2006.01)
*H01L 29/165* (2006.01)
*H01L 29/786* (2006.01)
*H01L 29/78* (2006.01)
*H01L 27/12* (2006.01)
*H01L 21/84* (2006.01)
*H01L 29/04* (2006.01)
*H01L 29/10* (2006.01)
H01L 21/762 (2006.01)
H01L 21/8238 (2006.01)

(56) References Cited

U.S. PATENT DOCUMENTS

| | | |
|---|---|---|
| 4,853,076 A | 8/1989 | Tsaur et al. |
| 4,855,245 A | 8/1989 | Neppl et al. |
| 4,952,524 A | 8/1990 | Lee et al. |
| 4,958,213 A | 9/1990 | Eklund et al. |
| 5,006,913 A | 4/1991 | Sugahara et al. |
| 5,060,030 A | 10/1991 | Hoke et al. |
| 5,081,513 A | 1/1992 | Jackson et al. |
| 5,108,843 A | 4/1992 | Ohtaka et al. |
| 5,134,085 A | 7/1992 | Gilgen et al. |
| 5,310,446 A | 5/1994 | Konishi et al. |
| 5,354,695 A | 10/1994 | Leedy |
| 5,371,399 A | 12/1994 | Burroughes et al. |
| 5,391,510 A | 2/1995 | Hsu et al. |
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,592,007 A | 1/1997 | Leedy |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,840,593 A | 11/1998 | Leedy |
| 5,861,651 A | 1/1999 | Brasen et al. |
| 5,880,040 A | 3/1999 | Sun et al. |
| 5,940,716 A | 8/1999 | Jin et al. |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,403,486 B1 | 6/2002 | Lou |
| 6,403,975 B1 | 6/2002 | Brunner et al. |
| 6,406,973 B1 | 6/2002 | Lee |
| 6,461,936 B1 | 10/2002 | von Ehrenwall |
| 6,476,462 B2 | 11/2002 | Shimizu et al. |
| 6,483,171 B1 | 11/2002 | Forbes et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,621,392 B1 | 9/2003 | Volant et al. |
| 6,635,506 B2 | 10/2003 | Volant et al. |
| 6,717,216 B1 | 4/2004 | Doris et al. |
| 6,825,529 B2 | 11/2004 | Chidambarrao et al. |
| 6,831,292 B2 | 12/2004 | Currie et al. |
| 6,974,981 B2 | 12/2005 | Chidambarrao et al. |
| 6,977,194 B2 | 12/2005 | Belyansky et al. |
| 7,015,082 B2 | 3/2006 | Doris et al. |
| 2001/0009784 A1 | 7/2001 | Ma et al. |
| 2002/0063292 A1 | 5/2002 | Armstrong et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2003/0094637 A1* | 5/2003 | Awano ................ 257/288 |
| 2004/0113174 A1 | 6/2004 | Chidambarrao et al. |
| 2004/0113217 A1 | 6/2004 | Chidambarrao et al. |
| 2004/0227169 A1* | 11/2004 | Kubo et al. ............. 257/288 |
| 2004/0238914 A1 | 12/2004 | Deshpande et al. |
| 2004/0262784 A1 | 12/2004 | Doris et al. |
| 2005/0040460 A1 | 2/2005 | Chidambarrao et al. |
| 2005/0082634 A1 | 4/2005 | Doris et al. |
| 2005/0093030 A1 | 5/2005 | Doris et al. |
| 2005/0098829 A1 | 5/2005 | Doris et al. |
| 2005/0106799 A1 | 5/2005 | Doris et al. |
| 2005/0145954 A1 | 7/2005 | Zhu et al. |
| 2005/0148146 A1 | 7/2005 | Doris et al. |
| 2005/0194699 A1 | 9/2005 | Belyansky et al. |
| 2005/0236668 A1 | 10/2005 | Zhu et al. |
| 2005/0245017 A1 | 11/2005 | Belyansky et al. |
| 2005/0280051 A1 | 12/2005 | Chidambarrao et al. |
| 2005/0282325 A1 | 12/2005 | Belyansky et al. |
| 2006/0027868 A1 | 2/2006 | Doris et al. |
| 2006/0038230 A1 | 2/2006 | Ueno et al. |
| 2006/0057787 A1 | 3/2006 | Doris et al. |
| 2006/0060925 A1 | 3/2006 | Doris et al. |
| 2006/0081875 A1* | 4/2006 | Lin et al. ................ 257/190 |
| 2006/0138398 A1* | 6/2006 | Shimamune et al. ........ 257/19 |
| 2008/0079034 A1* | 4/2008 | Komoda ................. 257/255 |

FOREIGN PATENT DOCUMENTS

| | | |
|---|---|---|
| JP | 64-76755 | 3/1989 |
| JP | 06-005483 | 1/1994 |
| JP | 2006013082 A | 1/2006 |
| JP | 200660188 | 3/2006 |
| JP | 2006186240 | 7/2006 |
| JP | 2006253317 | 9/2006 |
| JP | 2006521026 | 9/2006 |
| JP | 2007036205 A | 2/2007 |

OTHER PUBLICATIONS

Kern Rim, et al., "Characteristics and Device Design of Sub-100 nm Strained Si N- and PMOSFETs." 2002 Symposium on VLSI Technology Digest of Technical Papers, IEEE, pp. 98-99.

Gregory Scott, et al., "NMOS Drive Current Reduction Caused by Transistor Layout and Trench Isolation Induced Stress." International Electron Devices Meeting, 34.4.1, IEEE, Sep. 1999.

F. Ootsuka, et al., "A Highly Dense, High-Performance 130nm Node CMOS Technology for Large Scale System-on-a-Chip Application." International Electron Devices Meeting, 23.5.1, IEEE, Apr. 2000.

Shinya Ito, et al., "Mechanical Stress Effect of Etch-Stop Nitride and its Impact on Deep Submicron Transistor Design." International Electron Devices Meetiag, 10.7.1, IEEE, Apr. 2000.

(56) References Cited

OTHER PUBLICATIONS

A. Shimizu, et al., "Local Mechanical-Stress Control (LMC): A New Technique for CMOS-Performance Enhancement." International Electron Devices Meeting, IEEE, Mar. 2001.

K. Ota, et al., "Novel Locally Strained Channel Technique for High Performance 55nm CMOS." International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures." Paper 6.2, pp. 140-143.

C.J. Huang, et al., "Temperature Dependence and Post-Stress Recovery of Hot Electron Degradation Effects in Bipolar Transistors." IEEE 1991 Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003 IEEE GaAs Digest, pp. 263-266.

H. Worzer, et al., "Annealing of Degraded npn-Transistors-Mechanisms and Modelling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al., "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft=350/300 GHz and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.B. Van Der Merve, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al., "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for Si 1-x GEx Strained Layers on (100) Si". Appl. Phys. Lett. 56 (5), Jan. 29, 1990, pp. 460-462.

Q. Ouyang et al., "Two-Dimensional Bandgap Engineering in a Novel Si/SiGe pMOSFET with Enhanced Device Performance and Scalability". 2000 IEEE, pp. 151-154.

Yin, H. et al. "Fully-Depleted Strained-Si on Insulator NMOSFETs Without Relaxed SiGe Buffers." 2003, IEEE.

Letter from IBM Japan which indicates that the date of the issued Office Action is Dec. 10, 2013.

Information Materials for IDS from JPO Office Action Dated Nov. 13, 2012 JP Application No. JP2009517065 Filed: May 22, 2007.

Chinese Office Action dated Apr. 26, 2010.

PCT/EP2007/054932—Filed May 22, 2007—PCT ISR/WO.

\* cited by examiner

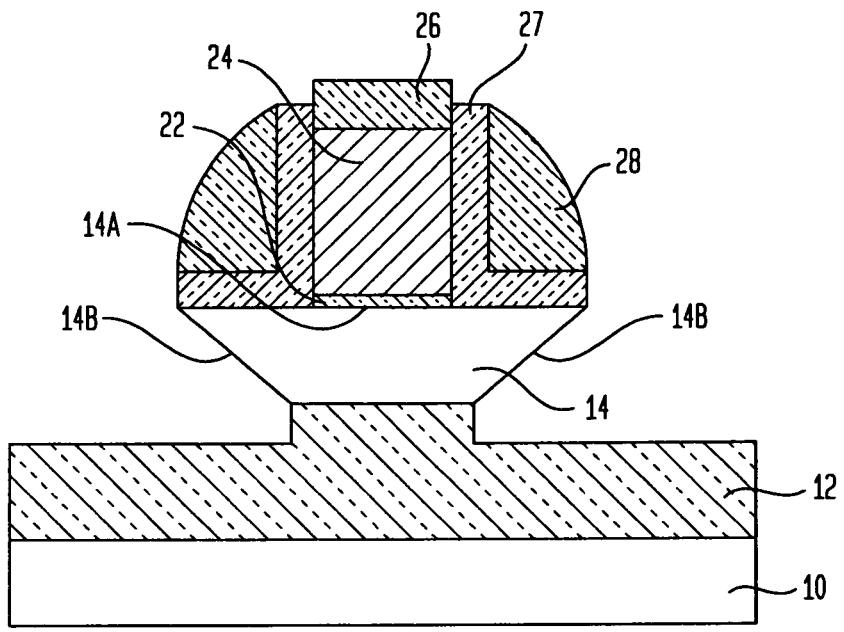
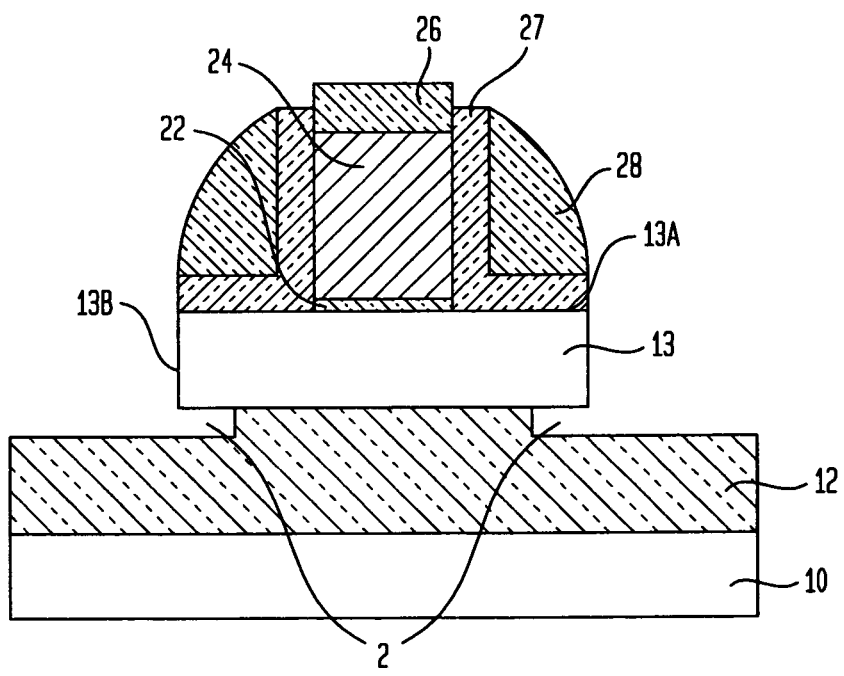

CMOS DEVICES WITH STRESSED CHANNEL REGIONS, AND METHODS FOR FABRICATING THE SAME

FIELD OF THE INVENTION

The present invention relates to semiconductor devices that can be used in complementary metal-oxide-semiconductor (CMOS) circuits. More specifically, the present invention relates to a CMOS circuit that comprises at least one field effect transistor (FET) with a stressed channel region, as well as methods for forming the FET by crystallographic etching and pseudomorphic growth of stressor layers.

BACKGROUND OF THE INVENTION

In present semiconductor technology, CMOS devices, such as n-channel FETs (n-FETs) and p-channel FETs (p-FETs), are typically fabricated upon semiconductor wafers comprised of single crystal semiconductor materials.

In single crystal semiconductor materials, all lattice directions and lattice planes in a unit cell of a single crystal material can be described by a mathematical description known as a Miller Index. Specifically, the notation [hkl] in the Miller Index defines a crystal direction or orientation. FIG. 1 shows a single crystal silicon unit cell, which is a cubic cell. Certain crystal directions, such as [001], [100], [010], [110], and [111], are specifically indicated by arrowheads in the cubic unit cell. Moreover, the crystal planes or facets of a single crystal silicon unit cell are defined by the notation (hkl) in Miller Index, which refers to a particular crystal plane or facet that is perpendicular to the [hkl] direction. FIG. 2 illustratively shows the crystal planes (100), (110), and (111) of the single crystal silicon unit cells, which are respectively perpendicular to the [100], [110], and [111] directions. Further, because the unit cells are periodic in a semiconductor crystal, there exist families or sets of equivalent crystal directions and planes. The notation <hkl> in the Miller Index therefore defines a family or set of equivalent crystal directions or orientations. For example, the <100> directions include the equivalent crystal directions of [100], [010], and [001]; the <110> directions include the equivalent crystal directions of [110], [011], [101], [−1−10], [0−1−1], [−10−1], [−110], [0−11], [−101], [1−10], [01−1], and [10−1]; and the <111> directions include the equivalent crystal directions of [111], [−111], [1−11], and [11−1]. Similarly, the notation {hkl} defines a family or set of equivalent crystal planes or facets that are respectively perpendicular to the <hkl> directions. For example, the {100} planes include the set of equivalent crystal planes that are respectively perpendicular to the <100> directions.

Semiconductor wafers typically each has a substrate surface oriented along one of a single set of equivalent crystal planes of the single crystal semiconductor material (e.g., Si) that forms the wafers. In particular, most of today's semiconductor devices are built upon silicon wafers having wafer surfaces oriented along one of the {100} crystal planes of silicon. However, electrons are known to have a high mobility along the {100} crystal planes of silicon, but holes are known to have high mobility along the {110} crystal planes of silicon. Specifically, hole mobility values along the {100} planes are roughly about 2 to 4 times lower than the corresponding electron hole mobility values along such planes. Furthermore, hole mobility values along the {110} silicon surfaces are about 2 times higher than those along the {100} silicon surfaces, but electron mobility along the {110} surfaces are significantly degraded compared to those along the {100} surfaces.

Therefore, there is a need for providing a semiconductor substrate having different surface orientations (i.e., hybrid surface orientations) that provide optimal performance for different devices.

Further, mechanical stresses within a semiconductor device substrate can also be used to modulate device performance. For example, in silicon, hole mobility is enhanced when the silicon film is under compressive stress in the film direction and/or under tensile stress in a direction normal of the silicon film, while the electron mobility is enhanced when the silicon film is under tensile stress in the film direction and/or under compressive stress in the direction normal of the silicon film. Therefore, compressive and/or tensile stresses can be advantageously created in the channel regions of a p-FET and/or an n-FET in order to enhance the performance of such devices.

However, the same stress component, either compressive or tensile stress, discriminatively affects the performance of a p-FET and an n-FET. In other words, compressive stress in the source-drain direction and/or tensile stress in the direction normal of the gate dielectric layer enhances the performance of the p-FET, but adversely impacts the performance of the n-FET, while tensile stress in the source-drain direction and/or compressive stress in the direction normal of the gate dielectric layer enhances the performance of the n-FET, but adversely impacts the performance of the p-FET. Therefore, p-FET and n-FET require different types of stresses for performance enhancement, which imposes a challenge for concurrent fabrication of high performance p-FET and n-FET, due to the difficulty in concurrently applying compressive stress in the source-drain direction to the p-FET and tensile stress to the n-FET, or concurrently applying tensile stress in the direction normal of the gate dielectric surface to the p-FET and compressive stress to the n-FET.

Embedded SiGe stressors have been used in the past to induce compressive strain in a p-FET channel region, consistent with the above-described approach. For example, a compressively stressed silicon channel layer can be formed between embedded SiGe stressors that are epitaxially grown over a silicon substrate. The lattice constant of germanium is greater than that of silicon, as shown in FIG. 3. As a result, epitaxial growth of SiGe on a silicon substrate will yield SiGe stressor layers with compressive stress, and the compressively stressed SiGe stressors will in turn apply compressive stress to the channel region located therebetween. For another example, a tensilely stressed silicon channel layer can be formed between embedded Si:C stressors that are epitaxially grown over a silicon substrate. Because the lattice constant of carbon is smaller than that of silicon, as shown in FIG. 3, epitaxial growth of Si:C over a silicon substrate will yield Si:C stressor layers with tensile stress, and the tensilely stressed Si:C stressors will in turn apply tensile stress to the channel region located therebetween.

However, the embedded SiGe or Si:C stressors can only be used to enhance the electron or hole mobility of one type of FETs (either n-type or p-type), but they will deleteriously reduce the carrier mobility in the complementary FETs. Although complementary Si:C or SiGe stressors can be independently formed in the complementary FETs, the use of different stress-inducing materials for the p-FETs and the n-FETs requires additional processing steps, which will significantly increase the processing complexity as well as the manufacturing costs.

There is therefore also a need for using the same stress-inducing materials to generate different stresses (i.e., compressive and tensile) in the n-FETs and the p-FETs for respectively enhancing electron mobility and hole mobility therein.

SUMMARY OF THE INVENTION

The inventors of the present invention have discovered that stressor layers comprised of the same stress-inducing material may be used to induce different types of stress in a semiconductor device structure, by positioning or orienting such stressor layers differently.

In one aspect, the present invention relates to a semiconductor device comprising a FET with a channel region located in a semiconductor device structure. Specifically, the semiconductor device structure has a top surface that is oriented along one of a first set of equivalent crystal planes and one or more additional surfaces that are oriented along a second, different set of equivalent crystal planes. One or more stressor layers (with intrinsic compressive or tensile stress) are located over the one or more additional surfaces of the semiconductor device structure and are arranged and constructed to apply stress (either tensile or compressive) to the channel region of the FET.

Preferably, but not necessarily, the semiconductor device structure comprises single crystal silicon, and the first and second set of equivalent crystal planes are selected from the group consisting of the {100}, {110}, and {111} planes of silicon.

In one specific embodiment of the present invention, the one or more stressor layers comprise SiGe and contain intrinsic compressive stress due to lattice mismatch between SiGe and Si, which is contained by the semiconductor device structure. When the one or more additional surfaces of the semiconductor device structure form acute angles with the top surface, the one or more stressor layers apply tensile stress to the channel region of the FET. Alternatively, when the one or more additional surfaces of the semiconductor device structure form obtuse angles with the top surface, the one or more stressor layers apply compressive stress to the channel region of the FET.

In an alternative embodiment of the present invention, the one or more stressor layers comprise Si:C and contain intrinsic tensile stress due to lattice mismatch between Si:C and Si, which is contained by the semiconductor device structure. When the one or more additional surfaces of the semiconductor device structure form acute angles with the top surface, the one or more stressor layers apply compressive stress to the channel region of the FET. Alternatively, when the one or more additional surfaces of the semiconductor device structure form obtuse angles with the top surface, the one or more stressor layers apply tensile stress to the channel region of the FET.

The semiconductor device structure of the present invention can be located over a substrate that comprises at least one insulator layer with a base semiconductor substrate layer thereunder, thereby forming a semiconductor-on-insulator (SOI) structure, or it can be located in a bulk semiconductor substrate structure. Further, the semiconductor device structure of the present invention may comprise a floating semiconductor body that is spaced apart from any substrate structure.

In another aspect, the present invention relates to a semiconductor device comprising an n-channel field effect transistor (n-FET) having an n-doped channel region located in a semiconductor device structure. The semiconductor device structure has a top surface that is oriented along one of a first set of equivalent crystal planes and one or more additional surfaces that are oriented along a second, different set of equivalent crystal planes. One or more stressor layers with intrinsic compressive or tensile stress are located over said one or more additional surfaces of the semiconductor device structure and are arranged and constructed to apply tensile stress to the n-doped channel region of the n-FET.

In one specific embodiment of the present invention, the one or more stressor layers comprise SiGe with intrinsic compressive stress therein, and the one or more additional surfaces of the semiconductor device structure preferably form acute angles with the top surface, so that the stressor layers apply tensile stress to the channel region of the n-FET. Alternatively, the one or more stressor layers comprise Si:C with intrinsic tensile stress therein, and the one or more additional surfaces of the semiconductor device structure form obtuse angles with the top surface, so that the one or more stressor layers apply tensile stress to the channel region of the n-FET.

In a further aspect, the present invention relates to a semiconductor device comprising a p-channel field effect transistor (p-FET) having a p-doped channel region located in a semiconductor device structure. The semiconductor device structure has a top surface oriented along one of a first set of equivalent crystal planes and one or more additional surfaces oriented along a second, different set of equivalent crystal planes. One or more stressor layers with intrinsic compressive or tensile stress are located over the one or more additional surfaces of the semiconductor device structure and are arranged and constructed to apply compressive stress to the p-doped channel region of the p-FET.

In one specific embodiment of the present invention, the one or more stressor layers comprise SiGe with intrinsic compressive stress therein, and the one or more additional surfaces of the semiconductor device structure preferably form obtuse angles with the top surface, so that the stressor layers apply compressive stress to the channel region of the p-FET. Alternatively, the one or more stressor layers comprise Si:C with intrinsic tensile stress therein, and the one or more additional surfaces of the semiconductor device structure form acute angles with the top surface, so that the one or more stressor layers apply compressive stress to the channel region of the p-FET.

In another aspect, the present invention relates to a method for forming a semiconductor device, comprising:

forming a semiconductor device structure having a top surface that is oriented along one of a first set of equivalent crystal planes and one or more additional surfaces that are oriented along a second, different set of equivalent crystal planes;

forming one or more stressor layers with intrinsic compressive or tensile stress over the one or more additional surfaces of the semiconductor device structure, wherein the one or more stressor layers are arranged and constructed to apply tensile or compressive stress to the semiconductor device structure; and forming an field effect transistor (FET) with a channel region located in the semiconductor device structure.

Preferably, but not necessarily, the semiconductor device structure, as described hereinabove, is formed by:

forming a semiconductor device layer having at least a top surface oriented along one of a first set of equivalent crystallographic planes;

selectively covering a portion of the semiconductor device layer;

anisotropically etching an uncovered portion of the semiconductor device layer to expose at least one of a bottom surface and one or more sidewall surfaces of the semiconductor device layer, the bottom surface and the sidewall surfaces are oriented along the first set of equivalent crystallographic planes; and crystallographically etching the at least one of the bottom surface and sidewall surfaces of the semiconductor device layer to form one or more additional surfaces that are oriented along a second, different set of equivalent crystallographic planes.

The one or more additional surfaces formed by the crystallographic etching may form either acute or obtuse angles with the top surface of the semiconductor device layer.

Further, the one or more stressor layer can be formed by epitaxially growing a semiconductor material having a lattice constant different from (i.e., either larger or smaller than) that of the semiconductor device structure, while the lattice mismatch between the stressor layers and the semiconductor device structure functions to generate corresponding stress in the stressor layers.

Other aspects, features and advantages of the invention will be more fully apparent from the ensuing disclosure and appended claims.

BRIEF DESCRIPTION OF THE DRAWINGS

FIGS. 6-9 illustrate exemplary processing steps that can be used for fabricating the FET device of FIG. 5, according to one embodiment of the present invention.

FIGS. 10-12 illustrates exemplary processing steps that can be used for fabricating an exemplary FET device with a channel region located in a double trapezoid semiconductor device structure with acute angles formed between a top surface and sidewall surfaces of the double trapezoid semiconductor device structure, according to one embodiment of the present invention.

DETAILED DESCRIPTION OF THE INVENTION, AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The term "equivalent crystal planes" as used in the present invention refers to a family of equivalent crystal planes or facets as defined by the Miller Indexes, as described hereinabove.

The term "Si:C" or "carbon-doped silicon" as used herein refers to a single crystal silicon having substitutional carbon atoms located therein. The substitutional carbon atoms and the silicon atoms form a silicon-carbon alloy, which is still a semiconductor material. The Si:C or carbon-doped silicon as used in the present invention is therefore distinguished from silicon carbide, which is a dielectric material that contains a carbon-silicon compound.

The present invention provides various configurations of semiconductor device structures with stressor layers that can be readily formed by crystallographic etching and pseudomorphic growth of semiconductor materials. Specifically, the semiconductor device structures and the stressor layers of the present invention can be arranged and constructed in various different manners to provide different strain conditions in the channel regions of FET devices for achieving optimal device performance.

The inventors of the present invention have discovered that a specific stress-inducing structure embedded in a semiconductor substrate can induce different types of stresses, depending on the locations of the stress measurement point in relation to the stress-inducing structure.

Figure 1:
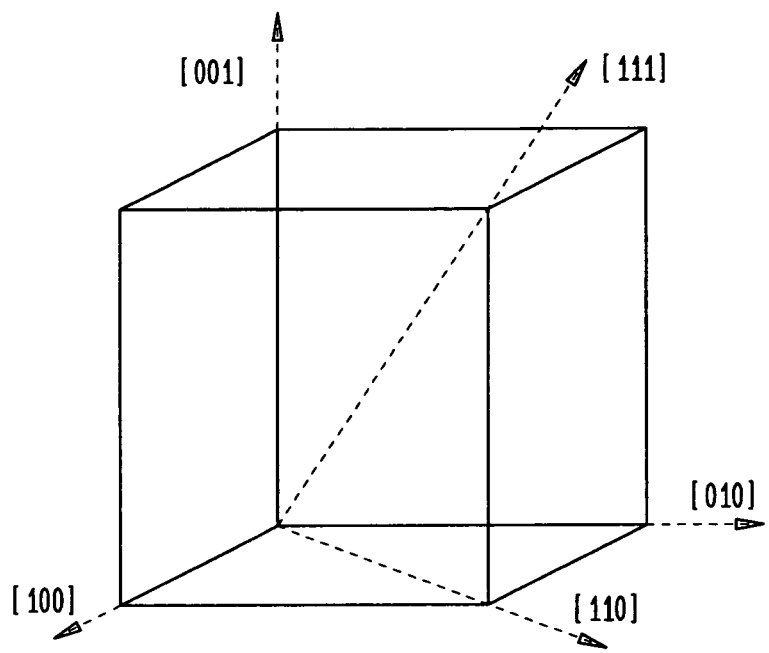
FIG. 1 shows a silicon crystal unit cell with certain crystal orientations specifically indicated by arrowheads.
Figure 2:
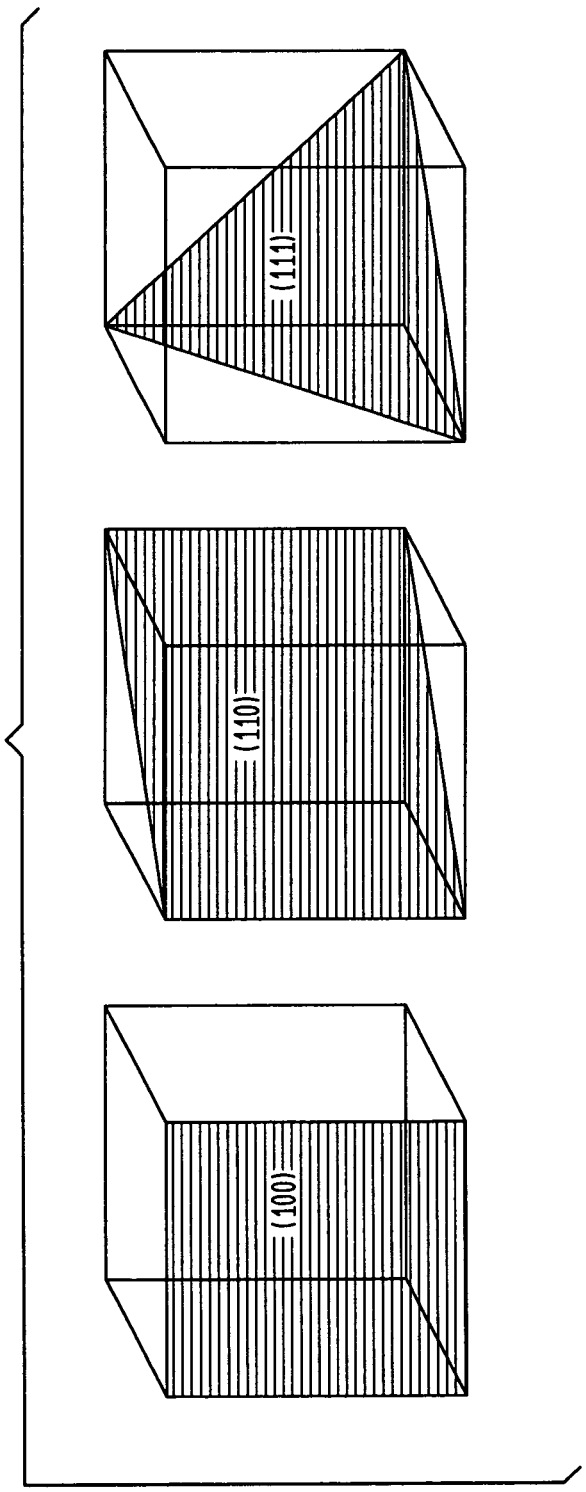
FIG. 2 shows certain specific crystal planes in silicon crystal unit cells.
Figure 3:
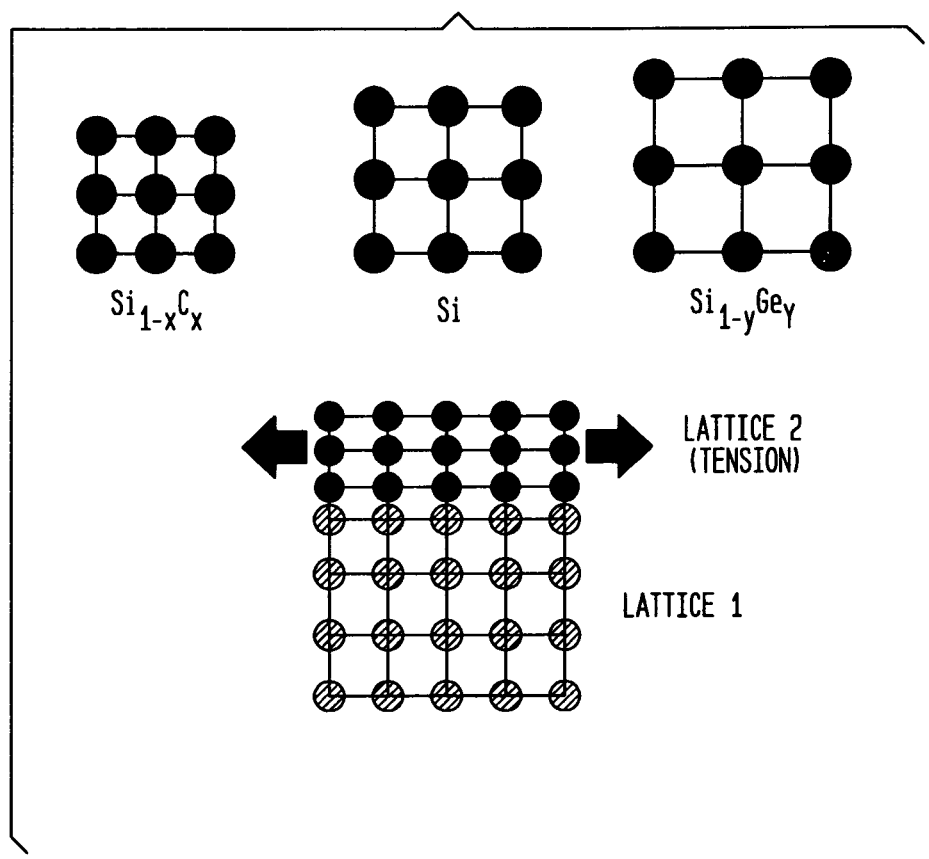
FIG. 3 illustrates crystal lattices of Si:C, Si, and SiGe and pseudomorphic growth of a second material layer having a smaller lattice constant (lattice 1) over a first material layer that has a larger lattice constant (lattice 2).
Figure 4:
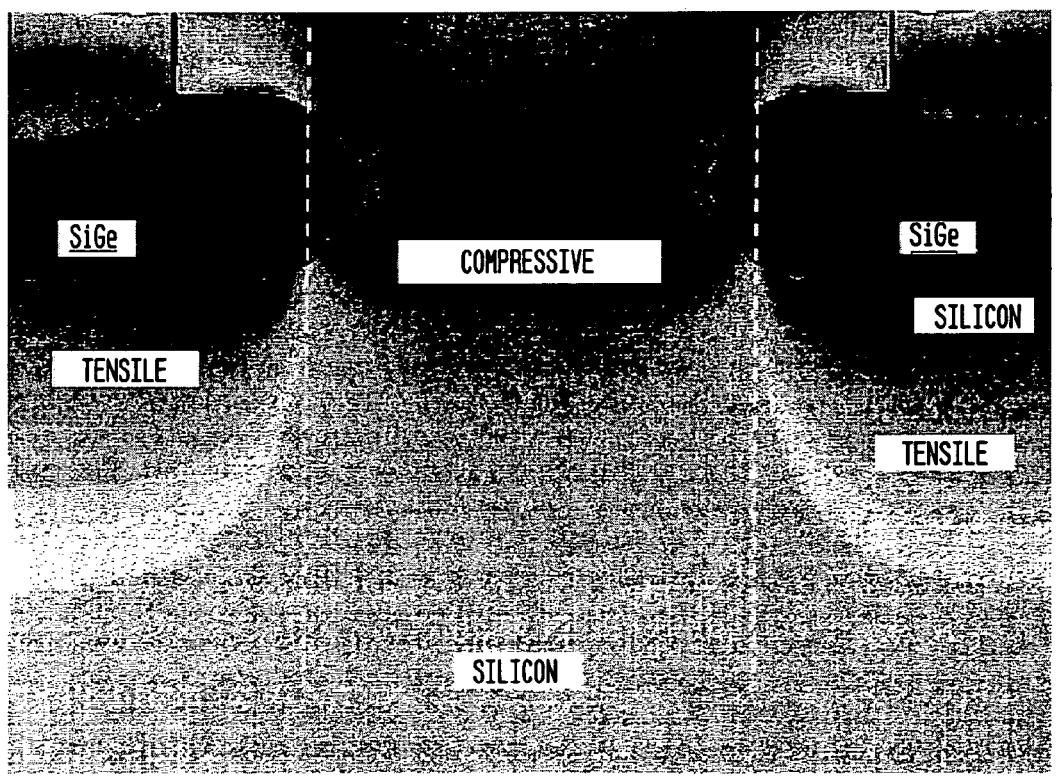
FIG. 4 is a simulated stress contour map that illustrates stress profiles around two SiGe structures embedded in a silicon substrate.

For example, FIG. 4 shows the stress profile near two compressively stressed SiGe layers that are embedded in a silicon substrate. Two white dotted lines are drawn at the respective ends of the SiGe layers along directions that are perpendicular to the linear portions of such SiGe layers. Each compressively stressed SiGe layer induces tensile stress in the region located at the side of the white dotted line that is immediately adjacent to the linear portion of the SiGe layer, but it induces compressive stress in the region located at the other side of the white dotted line away from the linear portion of the SiGe layer, as shown in FIG. 4.

It can therefore be inferred that if a channel layer is formed in the silicon substrate of FIG. 4 within the region located at the side of the white dotted line that is immediately adjacent to the linear portion of the SiGe layer, such a channel layer will contain tensile stress and is therefore suitable for forming an n-channeled FET due to enhanced electron mobility. However, if the channel layer is formed in the silicon substrate of FIG. 4 within the region located at the other side of the white dotted line away from the linear portion of the SiGe layer, such a channel layer will contain compressive stress and is suitable for forming a p-channeled FET instead, due to enhanced hole mobility.

Although FIG. 4 only shows the stress profile of compressively stressed SiGe layers that are embedded in a silicon substrate, a similar stress profile has been observed for tensilely stressed Si:C layers that are embedded in a silicon substrate, except that the types of stresses generated by the embedded Si:C layers are exactly opposite to those shown in FIG. 4. Specifically, the tensilely stressed Si:C layers will induce compressive stress in the regions located at the sides of the white dotted lines that are immediately adjacent to the linear portions of the Si:C layers, but they will induce tensile stress in the regions located at the other sides of the white dotted lines away from the linear portions of the Si:C layers.

In summary, embedded stressor layers containing a specific type of intrinsic stress (i.e., either compressive stress or tensile stress) can be used to create different types of stresses in different regions of the semiconductor substrate, depending on the spatial relations of such regions with respect to the embedded stressor layers. Therefore, by changing the relative positions of FET channel regions with respect to the stressor layers, the same type of stressor layers can be used to create different types of stresses in the FET channels. Correspondingly, the device performance of both n-FETs and p-FETs can be enhanced using the same type of stressor layers, with few or no additional processing steps.

Figure 5:
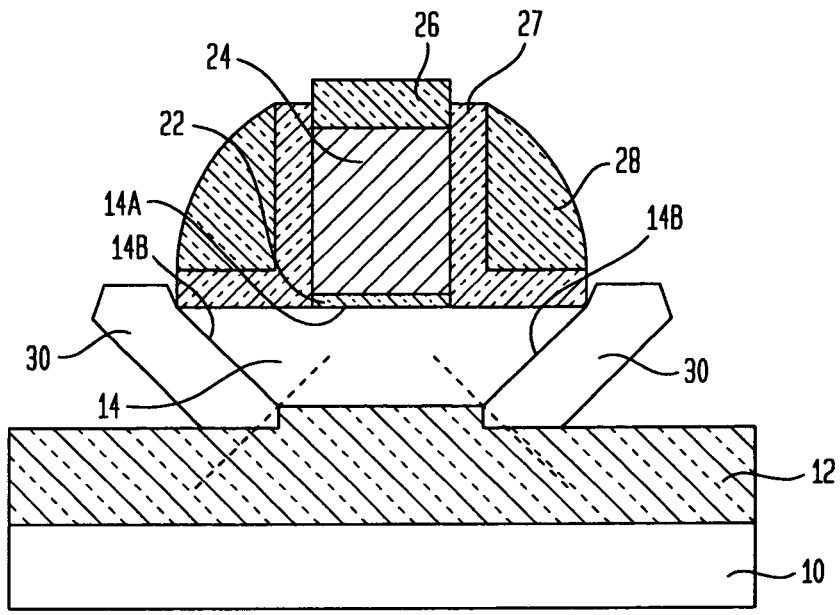
FIG. 5 is a cross-sectional view of an exemplary FET device with a channel region located in a trapezoidal semiconductor device structure with acute angles formed between a top surface and sidewall surfaces of the trapezoidal semiconductor device structure, according to one embodiment of the present invention.

FIG. 5 shows a cross-sectional view of an exemplary FET device with a channel region located in a trapezoidal semiconductor device structure 14. The trapezoidal semiconductor device structure 14 is located above a substrate structure that comprises an insulator layer 12 and a base semiconductor substrate 10 and underneath a gate stack that comprises a gate dielectric layer 22, a gate conductor 24, a dielectric cap layer 26, and optional spacers 27 and 28. The trapezoidal semiconductor device structure 14 has an upper surface 14A that is in direct contact with the gate dielectric layer 22 and two slanted sidewall surfaces 14B. Acute angles are formed between the upper surface 14A and the sidewall surfaces 14B of the trapezoidal semiconductor device structure 14. The FET channel (not shown) is defined by the gate stack and is therefore located in a portion of the trapezoidal semiconductor device structure 14 underneath the gate dielectric layer 22.

Two stressor layers 30, which contain intrinsic stresses of either compressive or tensile type, are formed over the slanted sidewall surfaces 14B of the trapezoidal semiconductor device structure 14, as shown in FIG. 5. Two dotted lines can be drawn at the respective ends of the stressor layers 30 along directions that are perpendicular to the linear portions of such stressor layers 30. As explained hereinabove, the stressor layers 30, which contain a specific type of intrinsic stress (either compressive or tensile) will create an opposite type of stress in regions of the trapezoidal semiconductor device structure 14 that are located at the sides of the dotted lines immediately adjacent to the linear portions of the stressor layers 30, and they will create the same type of stress in regions of the trapezoidal semiconductor device structure 14 that are located at the other sides of the dotted lines away from the linear portions of the stressor layers 30. Since most of the trapezoidal semiconductor device structure 14, including the portion directly underneath the gate dielectric layer 22, is located at the sides of the dotted lines immediately adjacent to the linear portions of the stressor layers 30, opposite type of stress will be created by the stressor layers 30 in most of the trapezoidal semiconductor device structure 14, including the portion directly underneath the gate dielectric layer 22.

Correspondingly, the FET channel (not shown), which is located in the portion of the trapezoidal semiconductor structure 14 directly underneath the gate dielectric layer 22, will have an opposite type of stress in comparison with the intrinsic stress contained by the stressor layers 30. For example, when the stressor layers 30 contain intrinsic compressive stress, the FET channel (not shown) will have tensile stress and is thus suitable for forming an n-channel in an n-FET due to enhanced electron mobility. Alternatively, when the stressor layers 30 contain intrinsic tensile stress, the FET channel (not shown) will have compressive stress created therein and is then suitable for forming a p-channel in a p-FET due to enhanced hole mobility.

FIGS. 6-9 illustrate exemplary processing steps that can be used for fabricating the FET device of FIG. 5, according to one embodiment of the present invention.

Figure 6:
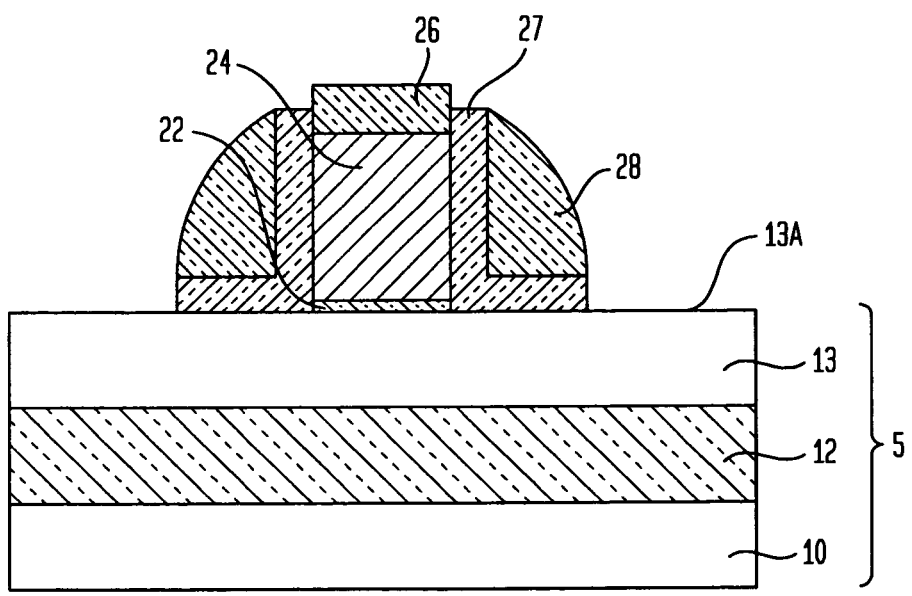

First, a patterned gate stack, which comprises a gate dielectric layer 22, a gate conductor layer 24, a dielectric cap layer 26, and optional spacers 27 and 28, is formed over a substrate structure 5, which preferably has a semiconductor-on-insulator (SOI) configuration and comprises a base semiconductor substrate 10, an insulator layer 12, and a semiconductor device layer 13, as shown in FIG. 6.

The base semiconductor substrate 10 may comprise any suitable semiconductor material, which includes, but is not limited to: Si, SiC, SiGe, SiGeC, Ge alloys, GaAs, InAs, InP, as well as other III-V or II-VI compound semiconductors, either in their single crystalline or polycrystalline form. The base semiconductor substrate 10 may also comprise an organic semiconductor or a layered semiconductor such as Si/SiGe, a silicon-on-insulator (SOI) or a SiGe-on-insulator (SGOI). Preferably, the base semiconductor substrate 10 is composed of a Si-containing semiconductor material, i.e., a semiconductor material that includes silicon. More preferably, the base semiconductor substrate 10 consists essentially of bulk single crystal silicon. Alternatively, the base semiconductor substrate 10 may comprise one or more buried insulator layers (not shown) therein. The base semiconductor substrate layer 10 may be doped, undoped or contain both doped and undoped regions (not shown) therein.

The insulator layer 12 may comprise any suitable insulator material(s), and it typically comprises an oxide, a nitride, or an oxynitride in either a crystalline phase or a non-crystalline phase. The physical thickness of the insulator layer 12 typically ranges from about 10 nm to about 400 nm, and more typically from about 20 nm to about 200 nm.

The semiconductor device layer 13 may comprise any single crystal semiconductor material, which includes, but is not limited to: Si, SiC, SiGe, SiGeC, Ge alloys, GaAs, InAs, InP, as well as other III-V or II-VI compound semiconductors. Preferably, the semiconductor device layer 13 is composed of a Si-containing semiconductor material, i.e., a semiconductor material that includes silicon. More preferably, the semiconductor device layer 13 consists essentially of single crystal silicon and has an upper surface 13A that is oriented along one of a first set of equivalent crystal planes of silicon. In one specific embodiment of the present invention, the upper surface 13A of the semiconductor device layer 13 is oriented along one of the {100} planes of silicon, so that the semiconductor device layer 13 can be used for forming a channel region for an n-FET device. In an alternative embodiment of the present invention, the upper surface 13A of the semiconductor device layer 13 is oriented along one of the {110} planes of silicon, so that the semiconductor device layer 13 can be used for forming a channel region for a p-FET device. Note that the semiconductor device layer 13 and the base semiconductor substrate layer 10 may be formed of the same semiconductor material or different types of semiconductor materials.

The SOI substrate structure 5 as shown in FIG. 6 can be formed in situ by depositing the insulator layer 12 over the base semiconductor substrate layer 10 via chemical vapor deposition, thermal oxidation or a combination thereof, followed by deposition of the semiconductor device layer 13. Alternatively, the SOI substrate structure 5 of FIG. 6 can be formed in situ by a silicon implanted oxide (SIMOX) process, during which oxygen ions are implanted into a bulk semiconductor substrate at a predetermined depth, followed by high temperature anneal to effectuate reaction between the semiconductor material and the implanted oxygen ions, thereby forming an oxide layer in the semiconductor substrate at the predetermined depth. Further, the SOI substrate structure 5 of FIG. 6 may be fabricated from pre-formed insulator and semiconductor layers by wafer-bonding or layer transfer techniques.

The gate dielectric layer 22 of the present invention may be comprised of any suitable dielectric material, including, but not limited to: oxides, nitrides, oxynitrides and/or silicates (including metal silicates and nitrided metal silicates). In one embodiment, it is preferred that the gate dielectric layer 22 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The physical thickness of the gate dielectric layer 22 may vary widely, depending on the specific deposition technique employed. Typically, the gate dielectric layer 24 has a thickness from about 0.5 to about 10 nm, with a thickness from about 1 to about 5 nm being more typical. The gate dielectric layer 22 can be formed by a thermal growing process such as, for example, oxidation, nitridation or oxynitridation. Alternatively, the gate dielectric layer 22 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric layer 22 may also be formed utilizing any combination of the above processes.

The gate conductor 24 and the optional dielectric cap layer 26 are formed over the gate dielectric layer 22, by first depositing a blanket gate conductor layer (not shown) and a blanket dielectric capping layer (not shown) over the gate dielectric layer 22, followed by patterning the blanket gate conductor layer (not shown) and the dielectric capping layer (not shown) into the gate conductor 24 and the optional dielectric cap layer 26 using conventional lithography and etching. The lithography step, preferably inverse gate level (PC) lithography, includes applying a photoresist (not shown) to the upper surface of the blanket dielectric capping layer (not shown), exposing the photoresist (not shown) to a desired pattern of radiation and developing the exposed photoresist (not shown) utilizing a conventional resist developer. The pattern in the photoresist (not shown) is then transferred to the underneath dielectric capping layer (not shown), the blanket gate conductor layer (not shown), and the blanket gate dielectric layer (not shown) utilizing one or more dry etching steps. Suitable dry etching processes that can be used in the present invention include, but are not limited to: reactive ion etching (RIE), ion beam etching, plasma etching or laser ablation. Preferably, but not necessarily, the gate conductor layer 24 comprises polycrystalline silicon (poly-Si), and the dielectric capping layer 26 comprises silicon nitride. The etching step preferably is carried out by RIE techniques. The patterned photoresist (not shown) is then removed by resist stripping after etching has been completed.

Although FIG. 6 shows formation of the gate stack before subsequent processing steps, such as etching, stressor deposition, and dopant implantation, it is also understood that a dummy gate (not shown) can be first formed in place of the gate stack as shown hereinabove in FIG. 6, and such a dummy gate (not shown) can then be replaced by a functional gate stack during a replacement gate process after the subsequent processing steps have been completed.

Figure 7:
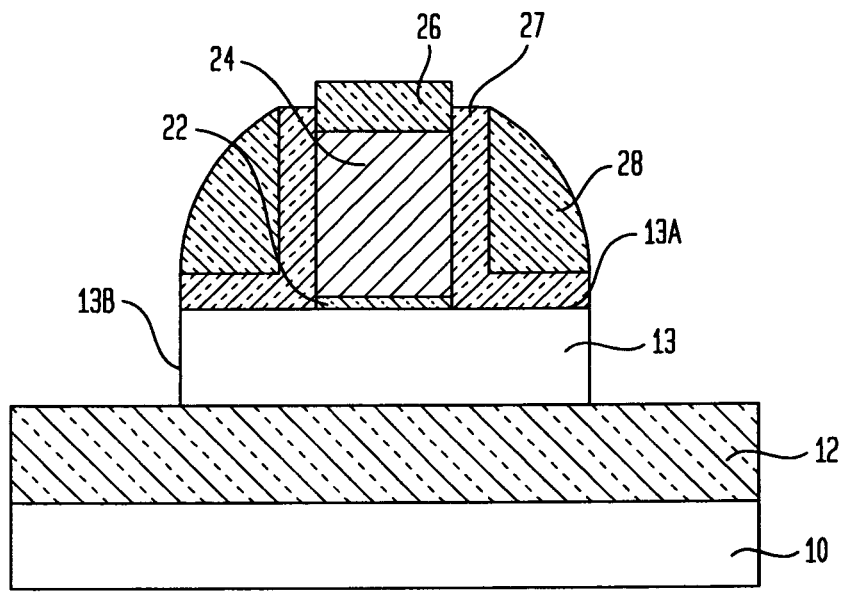

Next, an anisotropic etching step is carried out using the gate stack as a mask to pattern the semiconductor device layer 13, as shown in FIG. 7. The patterned semiconductor device layer 13 contains exposed sidewalls 13B that are aligned with the gate stack, and such exposed sidewalls 13B are oriented along the same set of equivalent crystal planes as the upper surface 13A of the semiconductor device layer 13. Any suitable etching chemistry that selectively etches silicon over silicon oxide and silicon nitride in an anisotropic manner can be used for patterning the semiconductor layer 13.

Preferably, but not necessarily, the anisotropic etching of the semiconductor device layer 13 is carried out by using one or more dry-etching processes, such as reactive ion etching (RIE), sputter etching, vapor phase etching, ion beam etching, plasma etching, and laser ablation. The dry-etching processes are directional (i.e., anisotropic), but they are mostly non-selective to different crystal planes or orientations, i.e., they etch the semiconductor material in approximately equal rates along all directions. In a particularly preferred embodiment of the present invention, the semiconductor device layer 13 is patterned using a reactive ion etching (RIE) process.

Figure 8:
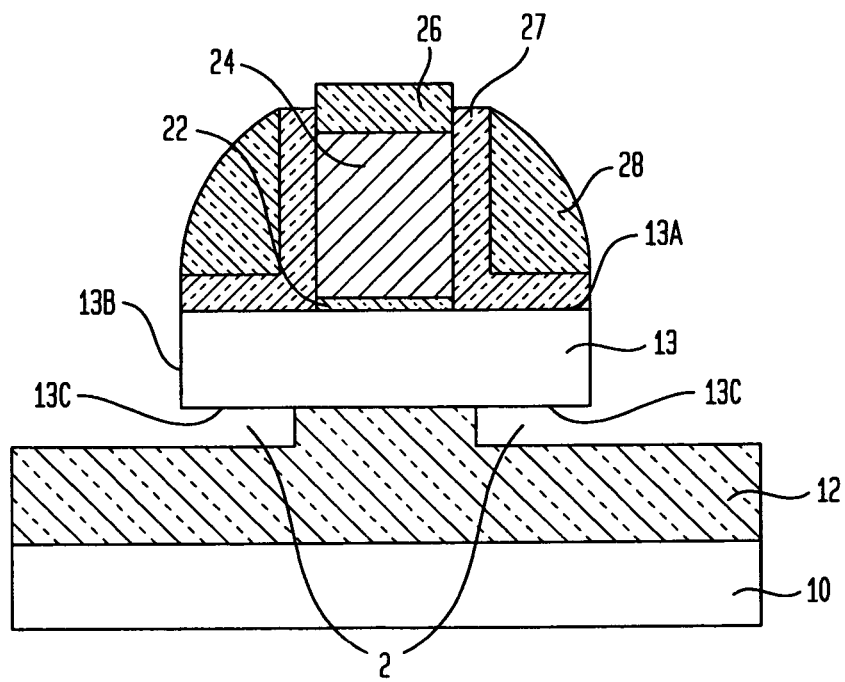

A lateral etching step is subsequently carried out to selectively removing a potion of the insulator layer 12 from underneath the patterned semiconductor layer 13, thereby forming undercut regions 2 and exposing portions of a lower surface 13C of the patterned semiconductor device layer 13, as shown in FIG. 8. The lateral etching step can be carried out using any suitable etching chemistry that selectively etches the insulator material contained by layer 12 over the semiconductor material contained by the semiconductor device layer 13.

After formation of the undercut regions 2 and exposure of the lower surface 13C of the patterned semiconductor device layer 13, a crystallographic etching step is carried out to etch the exposed sidewall surfaces 13B and the exposed portions of the lower surface 13C of the patterned semiconductor device layer 13.

Crystallographic etching of the semiconductor device layer 13 is preferably carried out by one or more wet-etching processes, which employ etching solutions such as hydroxide-based etching solutions, ethylene diamine pyrocatechol (EDP)-based etching solutions, etc., to etch the semiconductor device layer 13 at significantly different rates along different crystal planes or orientations. Therefore, the crystallographic etching is an isotropic process, but the etching pattern formed by the crystallographic etching process proceeds along the fast-etched crystal planes and is eventually terminated by the slowly etched crystal planes.

For example, an etching solution that comprises approximately 23.4% KOH, 13.3% isopropyl alcohol (IPA), and 63.3% water, when heated to about 80° C., etches the single crystal silicon at an etching rate of about 1.0 μm/minute along the {100} planes, but at an etching rate of about 0.06 μm/minute along the {110} planes. In other words, this etching solution etches the {100} planes about 17 times faster than the {110} planes. Therefore, such an etching solution can be used to etch a silicon substrate to form a recess that is terminated at the {110} planes.

In contrast, an etching solution that comprises approximately 44% KOH and 56% water, when heated to about 120° C., etches the single crystal silicon at an etching rate of about 11.7 μm/minute along the {110} planes, about 5.8 μm/minute along the {100} planes, and about 0.02 μm/minute along the {111} planes. In other words, this etching solution etches the {110} and {100} planes significantly faster than the {111} planes (more than 550 and 250 times faster, respectively). Therefore, such an etching solution can be used to etch a silicon substrate to form a recess that is terminated at the {111} planes.

In the present invention, the crystallographic etching step is carried out using an etching chemistry that etches the crystal planes of the exposed lower surface 13C and the sidewall surfaces 13B of the semiconductor device layer 13 at an etching rate faster than other crystal planes, so that the crystallographic etching terminates along a set of crystal planes that is different from the lower surface 13C and the sidewall surfaces 13B. As specifically illustrated by FIG. 9, the semiconductor device layer 13 is crystallographically etched to form a trapezoidal semiconductor device structure 14 with an upper surface 14A oriented along a first set of crystal planes and sidewall surfaces 14B oriented along a second, different set of crystal planes. The second, different set of crystal planes are slanted away from the first set of crystal planes, and acute angles are formed between the upper surface 14A and the sidewall surfaces 14B of the trapezoidal semiconductor device structure 14.

Note that although dry-etching is typically used for anisotropic etching, certain dry-etching techniques, such as RIE, can also be used for the crystallographic etching. In RIE, the substrate is placed inside a reactor in which several gases are introduced. A plasma is introduced in the gas mixture using an radio-frequency (RF) power source, breaking the gas molecules into ions. The ions are accelerated towards, and react at, the surface of the material being etched, forming another gaseous material. This is known as the chemical part of reactive ion etching, which is isotropic. The RIE also has a physical aspect: if the ions have high enough energy, the ions can knock atoms out of the material to be etched without a chemical reaction. The physical etching aspect of RIE is high anisotropic. Therefore, RIE is a complex process that involves both chemical and physical etching. By carefully adjusting the balance between the chemicals aspect and the physical aspect of RIE, this process can be used to achieve either anisotropic or crystallographic etching results. Similarly, although wet-etching is typically used for the crystallographic etching, certain wet-etching chemistries can also be used to achieve anisotropic etching results.

Therefore, the present invention is not limited to the use of dry-etching for the anisotropic etching process and the use of wet-etching for the crystallographic etching process, but encompasses all suitable etching processes and techniques that can be used to achieved the desired anisotropic and crystallographic results as described hereinabove.

After formation of the trapezoidal semiconductor device structure 14, an epitaxial growth step can be carried out to pseudomorphically grow the stressor structures 30 along the slanted sidewalls 14B of the trapezoidal semiconductor device structure 14 so as to form the FET device structure in FIG. 5.

The stressor structures 30 may comprise any semiconductor material having a lattice constant different from that of the trapezoidal semiconductor device structure 14, so that lattice mismatch between the stressor structures 30 and the semiconductor device structure 14 can generate tensile or compressive stress in the stressor structures 30 as well as in the semiconductor device structure 14, as described hereinabove. For example, when the stressor structures 30 contain SiGe, compressive stress will be created in the stressor structures 30, while tensile stress will be created in the FET channel (not shown) located in the trapezoidal semiconductor device structure 14. In this manner, the trapezoidal semiconductor device structure 14 is suitable for forming an n-channel in an n-FET. Alternatively, when the stressor structures 30 contain Si:C, tensile stress will be created in the stressor structures 30, while compressive stress will be created in the FET channel (not shown) located in the trapezoidal semiconductor device structure 14. In this manner, the trapezoidal semiconductor device structure 14 is suitable for forming an p-channel in a p-FET.

Additional CMOS processing steps, such as source/drain extension implantation, source/drain implantation, salicidation, etc., can be further carried out to form a complete FET (either n-channel or p-channel) device structure, which contain a channel region with the desired stress (either tensile or compressive).

Figure 11:
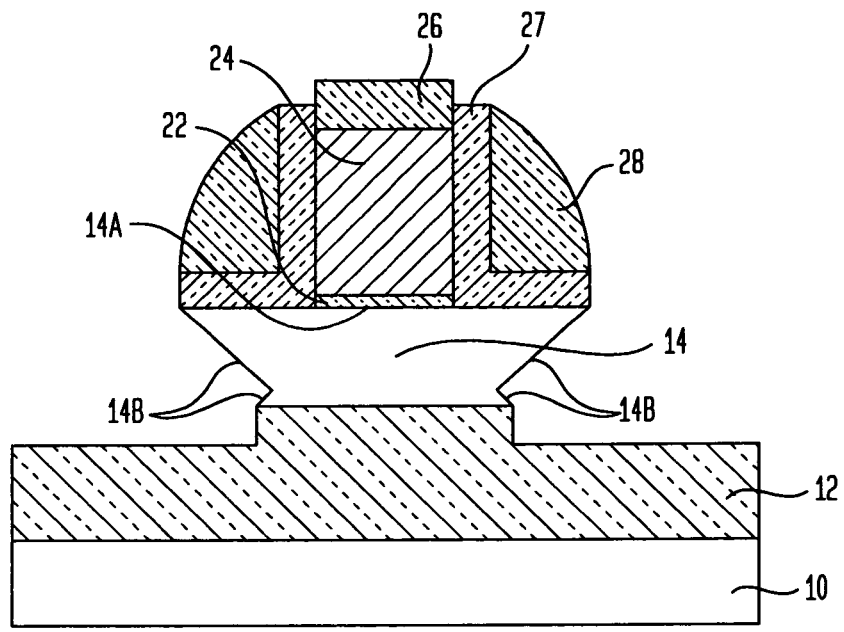
Figure 12:
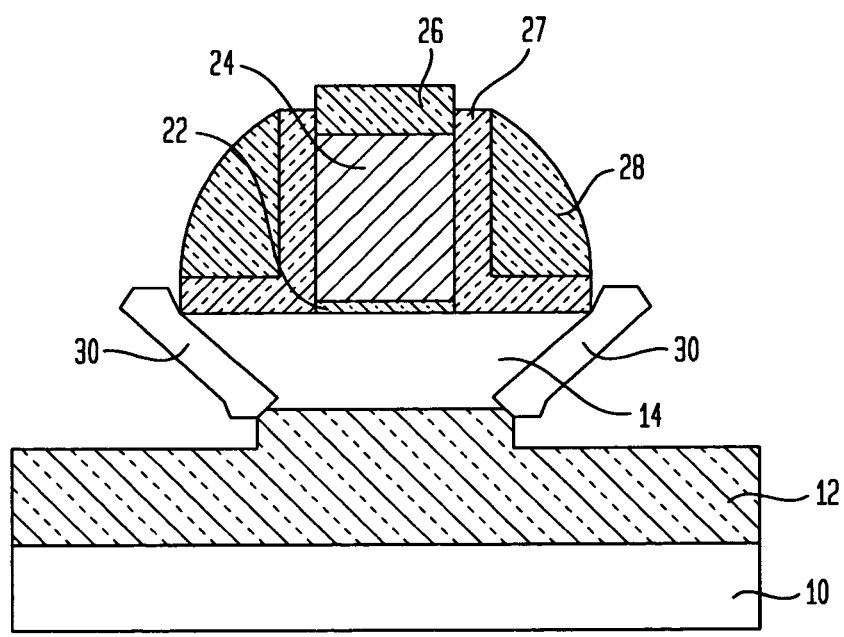

FIGS. 10-12 illustrates exemplary processing steps that can be used for fabricating an exemplary FET device with a channel region located in a double trapezoid semiconductor device structure with acute angles formed between a top surface and sidewall surfaces of the double trapezoid semiconductor device structure, according to one embodiment of the present invention.

Specifically, after the anisotropic patterning of the semiconductor device layer 13, a lateral etching step is carried out to form relatively small undercut regions 2 (in comparison with those shown in FIG. 8), so that the subsequent crystallographic etching of the semiconductor device layer 13 forms a double trapezoid semiconductor device structure 14 with an upper surface 14A and sidewall surfaces 14B, as shown in FIGS. 10-11. Upper portions of the sidewall surfaces 14B still form acute angles with the upper surface 14A of the double trapezoid semiconductor device structure 14, as shown in FIG. 11, although lower portions of the sidewall surfaces 14B now flare out to form a base for the double trapezoid semiconductor device structure 14. An epitaxial growth step can then be carried out to pseudomorphically grow stressor structures 30 along both the upper and lower portions of the sidewalls 14B of the double trapezoidal semiconductor device structure 14, as shown in FIG. 12.

Figure 13:
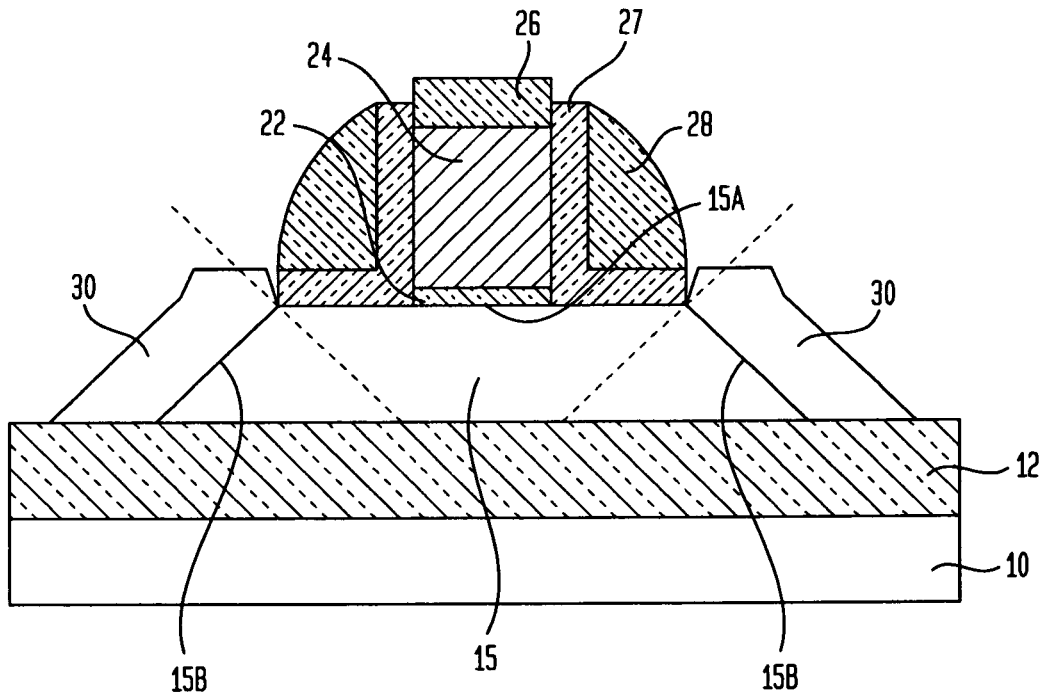
FIG. 13 is a cross-sectional view of an exemplary FET device with a channel region located in a trapezoidal semiconductor device structure with obtuse angles formed between a top surface and sidewall surfaces of the trapezoidal semiconductor device structure, according to one embodiment of the present invention.

FIG. 13 is a cross-sectional view of an exemplary FET device with a channel region located in a trapezoidal semiconductor device structure 15, according to one embodiment of the present invention. The trapezoidal semiconductor device structure 15 of FIG. 13 is similar to the trapezoidal semiconductor device structure 14 of FIG. 5, except that obtuse (instead of acute) angles are formed between a top surface 15A and sidewall surfaces 15B of the trapezoidal semiconductor device structure 15.

The stressor layers 30 are formed over the slanted sidewall surfaces 14B of the trapezoidal semiconductor device structure 15, as shown in FIG. 13. Two dotted lines can be drawn at the respective ends of the stressor layers 30 along directions that are perpendicular to the linear portions of such stressor layers 30. As explained hereinabove, the stressor layers 30, which contain a specific type of intrinsic stress (either compressive or tensile) will create an opposite type of stress in regions of the trapezoidal semiconductor device structure 15 that are located at the sides of the dotted lines immediately adjacent to the linear portions of the stressor layers 30, and they will create the same type of stress in regions of the trapezoidal semiconductor device structure 15 that are located at the other sides of the dotted lines away from the linear portions of the stressor layers 30. Since most of the trapezoidal semiconductor device structure 15, including the portion directly underneath the gate dielectric layer 22, is located at the sides of the dotted lines away from the linear portions of the stressor layers 30, same type of stress will be created by the stressor layers 30 in most of the trapezoidal semiconductor device structure 15, including the portion directly underneath the gate dielectric layer 22.

Correspondingly, the FET channel (not shown), which is located in the portion of the trapezoidal semiconductor structure 15 directly underneath the gate dielectric layer 22, will have the same type of stress as that contained by the stressor layers 30. For example, when the stressor layers 30 contain intrinsic compressive stress, the FET channel (not shown) will have compressive stress and is thus suitable for forming a p-channel in a p-FET due to enhanced hole mobility. Alternatively, when the stressor layers 30 contain intrinsic tensile stress, the FET channel (not shown) will have tensile stress created therein and is then suitable for forming an n-channel in an n-FET due to enhanced electron mobility.

Figure 14:
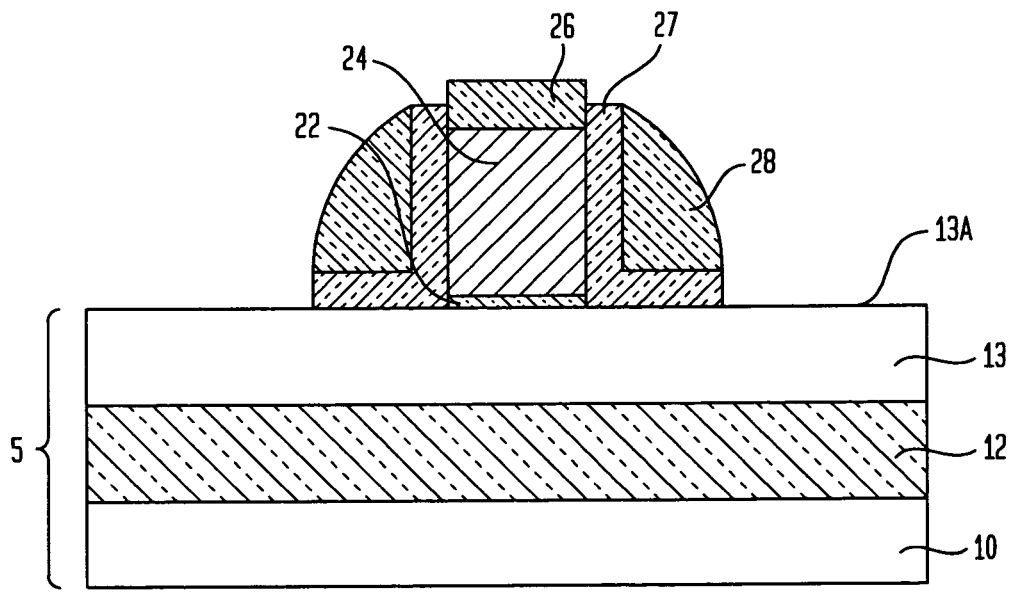
FIGS. 14-16 illustrate exemplary processing steps that can be used for fabricating the FET device of FIG. 5, according to one embodiment of the present invention.
Figure 15:
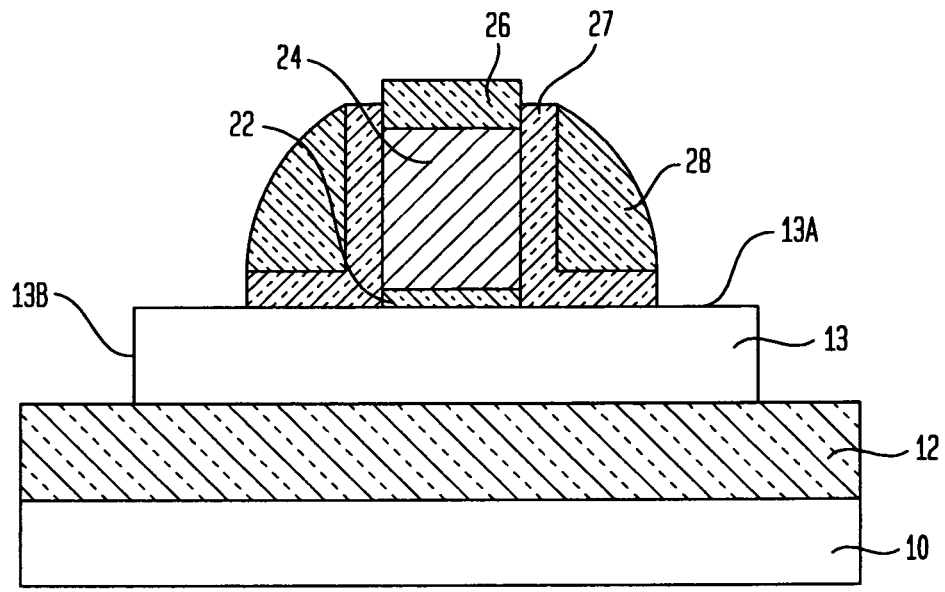
Figure 16:
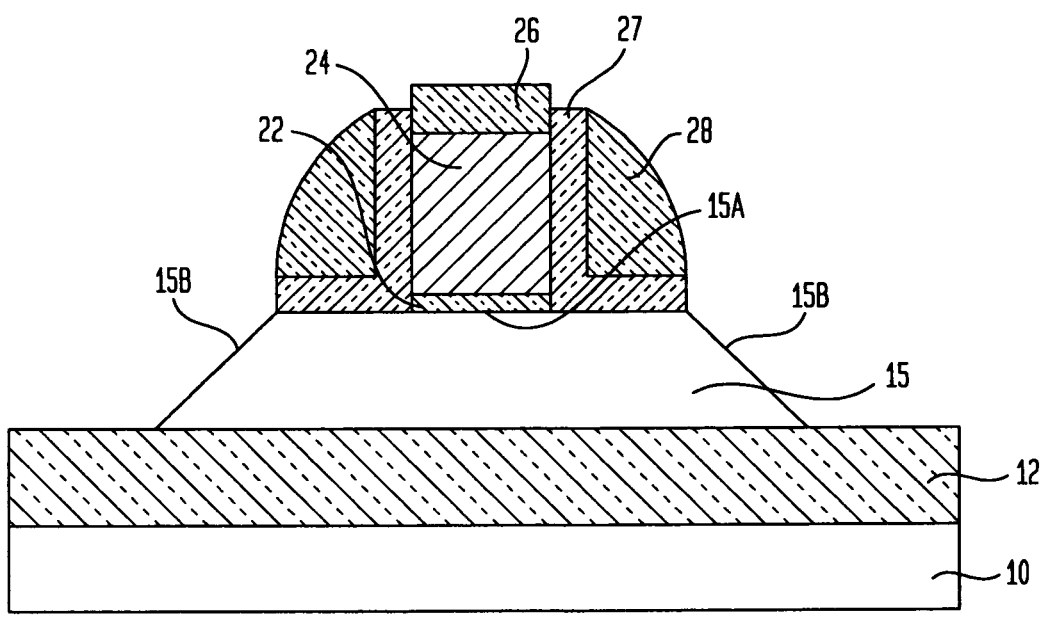

The trapezoidal semiconductor device structure 15 of FIG. 13 can be readily formed by exemplary processing steps of FIGS. 14-16, according to one embodiment of the present invention.

First, a patterned gate stack, which comprises a gate dielectric layer 22, a gate conductor layer 24, a dielectric cap layer 26, and optional spacers 27 and 28, is formed over a substrate structure 5, which preferably has a semiconductor-on-insulator (SOI) configuration and comprises a base semiconductor substrate 10, an insulator layer 12, and a semiconductor device layer 13, as shown in FIG. 14. Next, an anisotropic etching step is carried out to pattern the semiconductor device layer 13, while a portion of the upper surface 13A and the sidewall surfaces 13B of the device layer 13 are exposed, as shown in FIG. 15. Subsequent crystallographic etching of such a patterned semiconductor device layer 13 thus forms the trapezoidal semiconductor device structure 15 with obtuse angles formed between the upper surface 15A and the sidewall surfaces 15B, as shown in FIG. 16. Pseudomorphic growth of stressor structures 30 over the sidewall surfaces 15B of the trapezoidal semiconductor device structure 15 will form the FET device as shown in FIG. 13.

Figure 17:
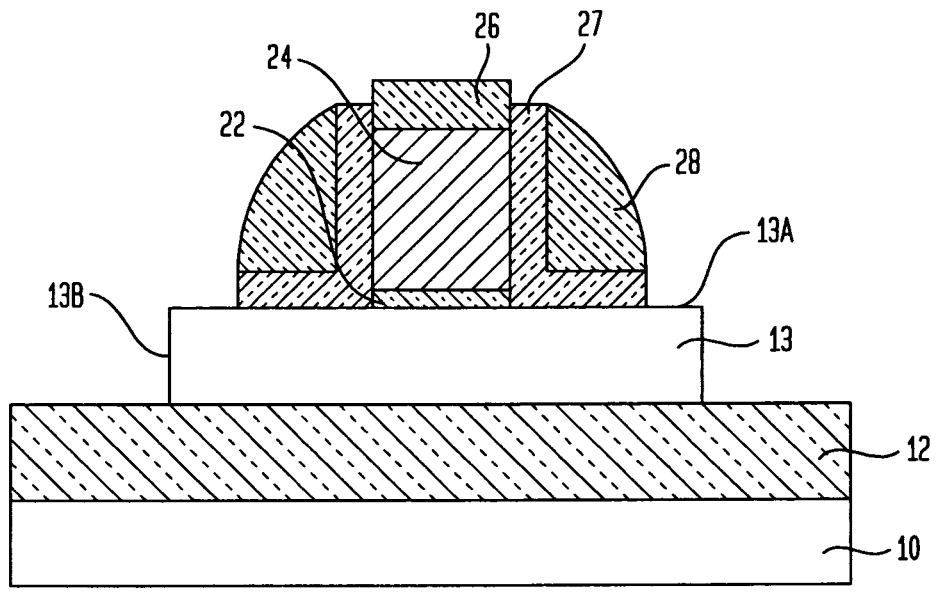
FIGS. 17-19 illustrate exemplary processing steps that can be used for forming an exemplary FET device with a channel region located in a trapezoidal semiconductor device structure, which is similar to that shown by FIG. 13 but has significant undercut beneath the FET gate stack, according to one embodiment of the present invention.
Figure 18:
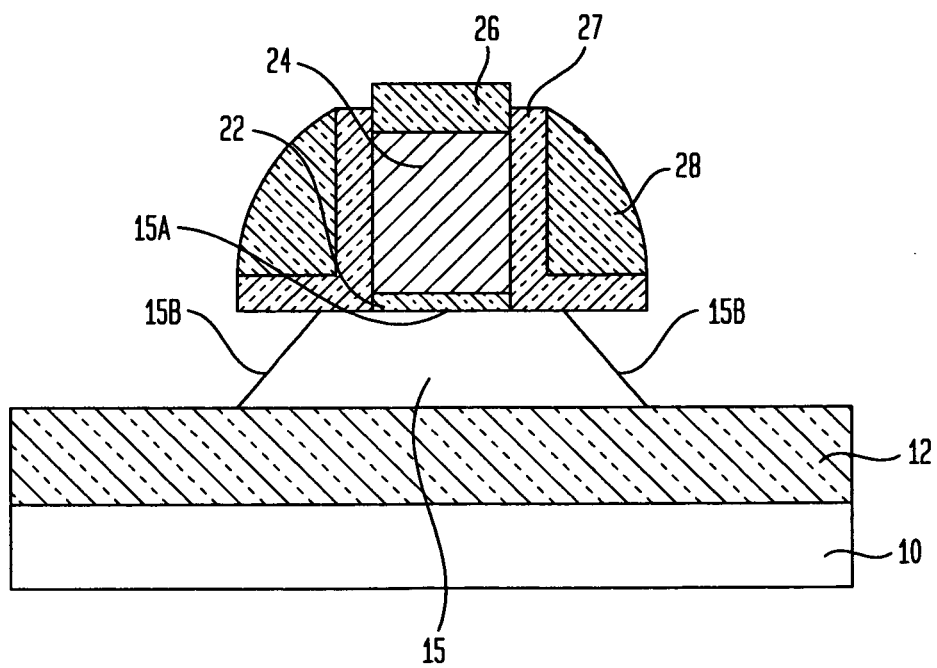
Figure 19:
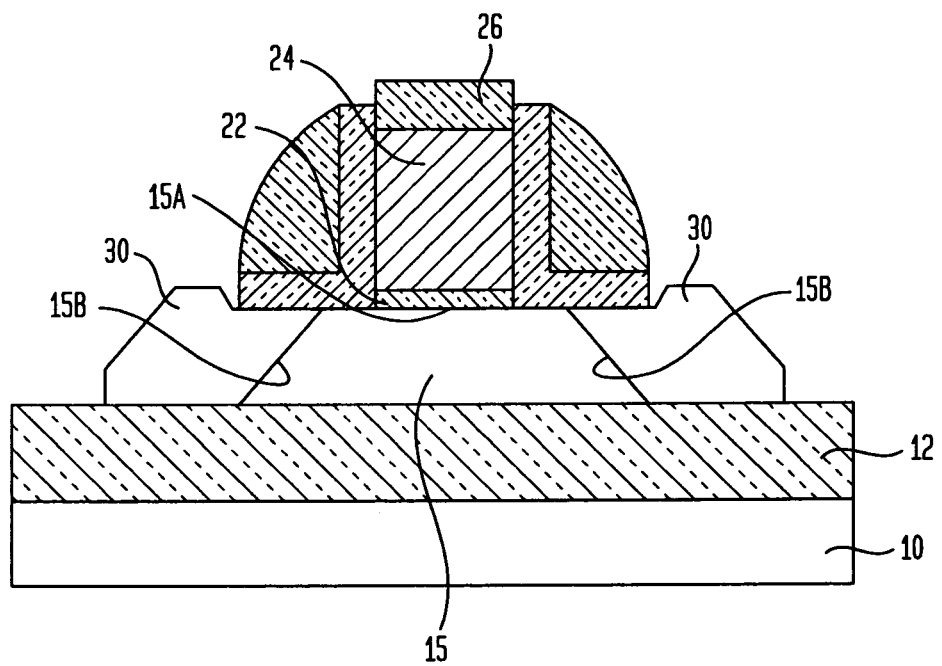

FIGS. 17-19 illustrate exemplary processing steps that can be used for forming another exemplary FET device with a channel region located in a trapezoidal semiconductor device structure, which is similar to that shown by FIG. 13 but has significant undercut beneath the FET gate stack, according to one embodiment of the present invention. Specifically, the semiconductor device layer 13 is patterned by an anisotropic etching step, while a relatively smaller portion (in comparison with that shown in FIG. 15) of the upper surface 13A of the layer 13 is exposed, as shown in FIG. 17. Subsequent crystallographic etching of such a patterned semiconductor device layer 13 thus forms a trapezoidal semiconductor device structure 15 that undercuts the gate stack, as shown in FIG. 18. Pseudomorphic growth of stressor structures 30 over the sidewall surfaces 15B of the trapezoidal semiconductor device structure 15 of FIG. 18 will form the FET device as shown in FIG. 19.

Figure 20:
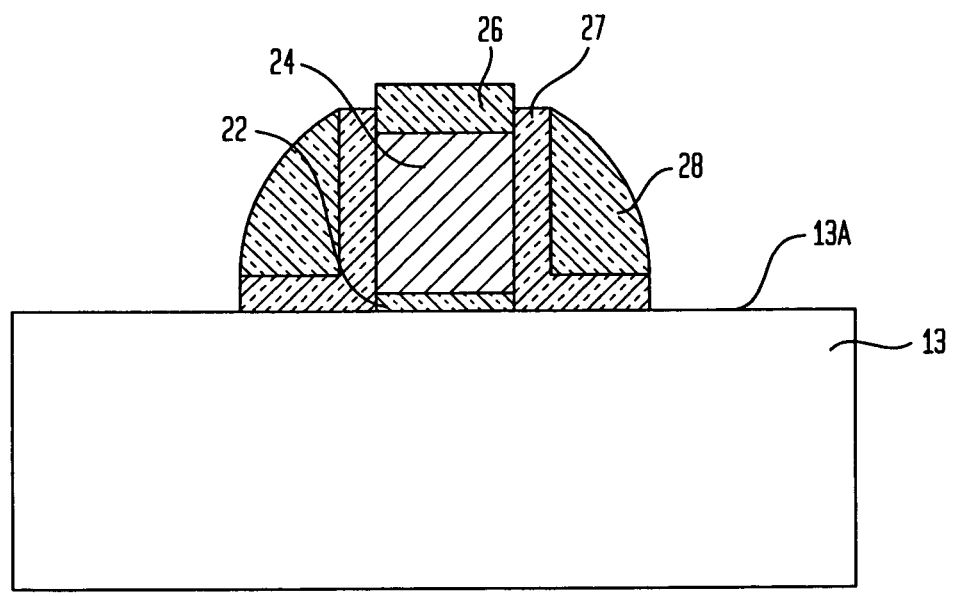
FIGS. 20-23 illustrate exemplary processing steps for forming an FET device with a channel region located in an hourglass-shaped semiconductor device structure with acute angles formed between a top surface and sidewall surfaces of the hourglass-shaped semiconductor device structure, according to one embodiment of the present invention.
Figure 21:
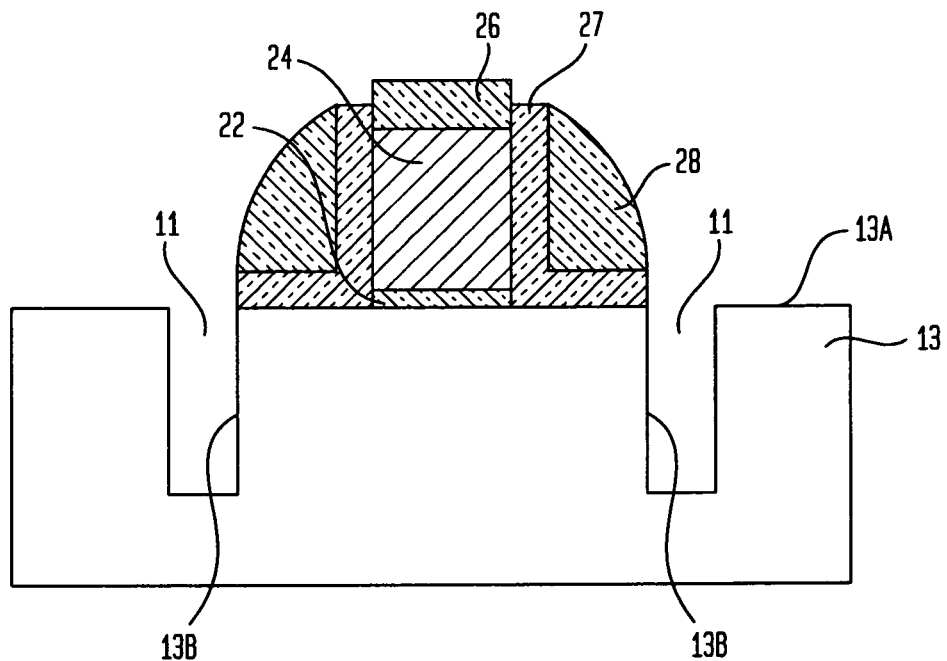
Figure 22:
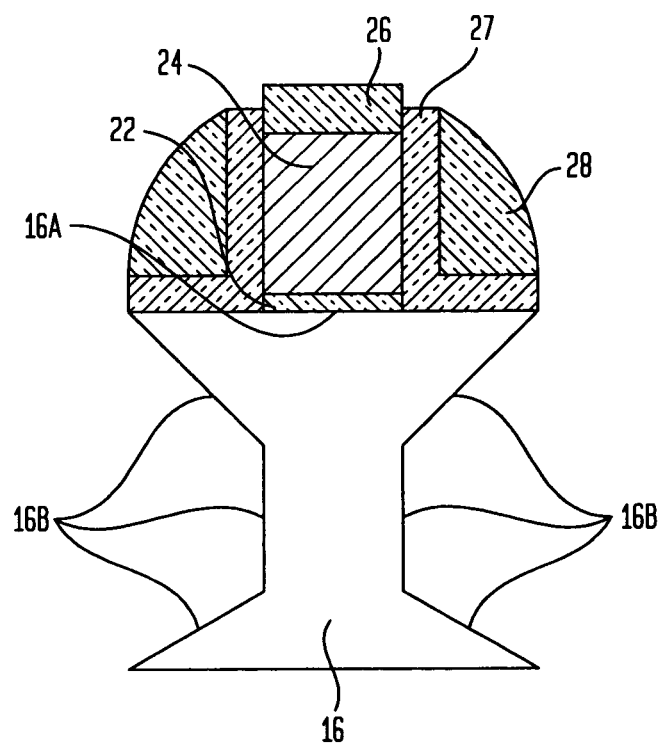
Figure 23:
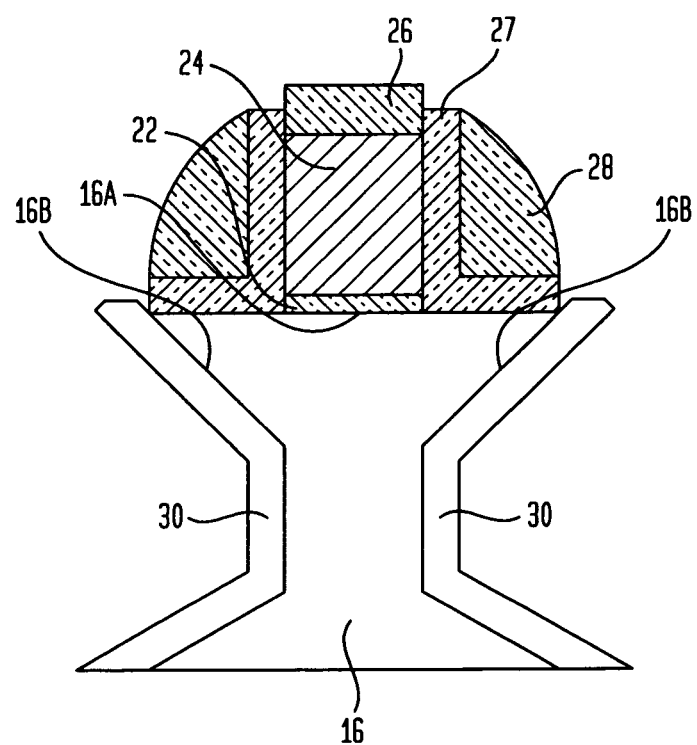

FIGS. 20-23 illustrate exemplary processing steps for forming an FET device with a channel region located in an hourglass-shaped semiconductor device structure, according to one embodiment of the present invention. Specifically, a patterned gate stack, which comprises a gate dielectric layer 22, a gate conductor layer 24, a dielectric cap layer 26, and optional spacers 27 and 28, is first formed over a bulk semiconductor substrate structure 13 that has an upper surface 13A, as shown in FIG. 20. An anisotropic etching step is then carried out to form trenches 11 with exposed trench sidewalls 13B in the bulk semiconductor substrate structure 13, as shown in FIG. 21. Subsequent crystallographic etching of the bulk semiconductor substrate structure 13 along the trenches 11 thus forms a hourglass-shaped semiconductor device structure 16 with an upper surface 16A and sidewall surfaces 16B, while acute angles are formed between the top surface 16A and upper portions of the sidewall surfaces 16B, as shown in FIG. 22. Pseudomorphic growth of stressor structures 30 over the sidewall surfaces 16B of the hourglass-shaped semiconductor device structure 16 of FIG. 12 will form the FET device as shown in FIG. 23.

Figure 25A:
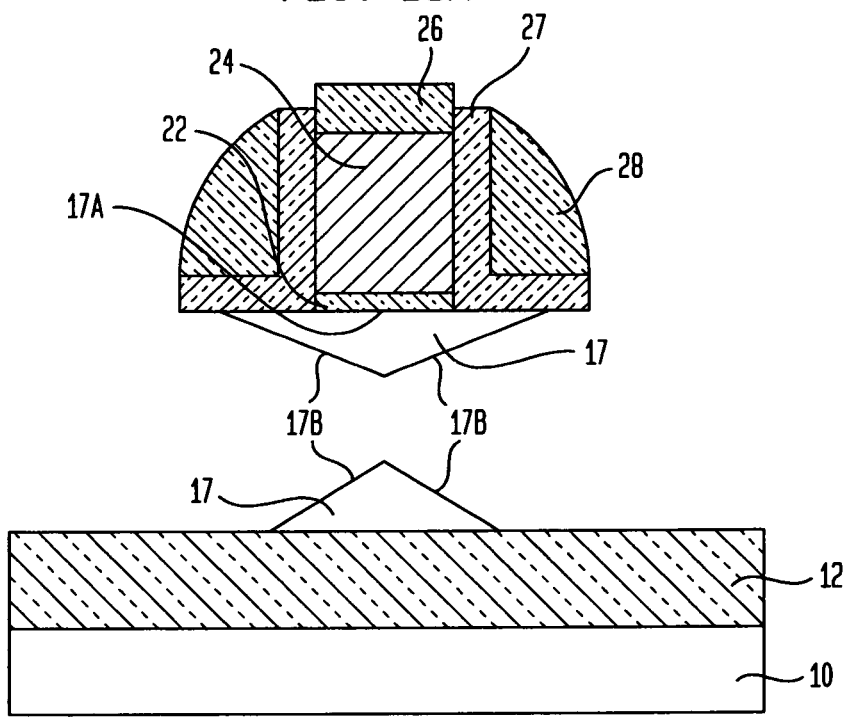
Figure 25B:
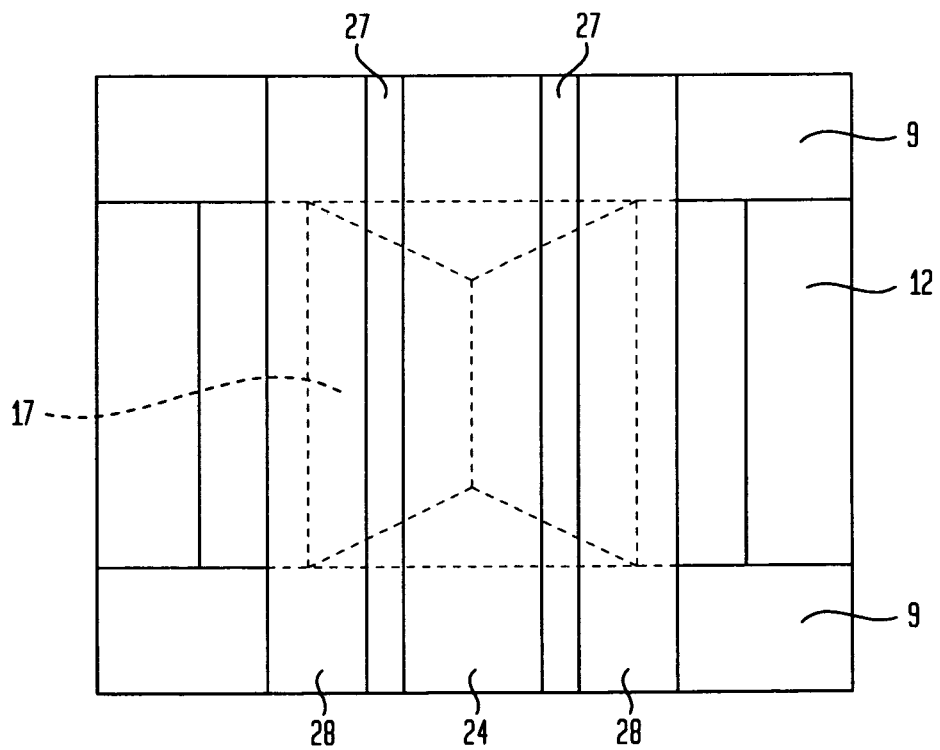
Figure 26:
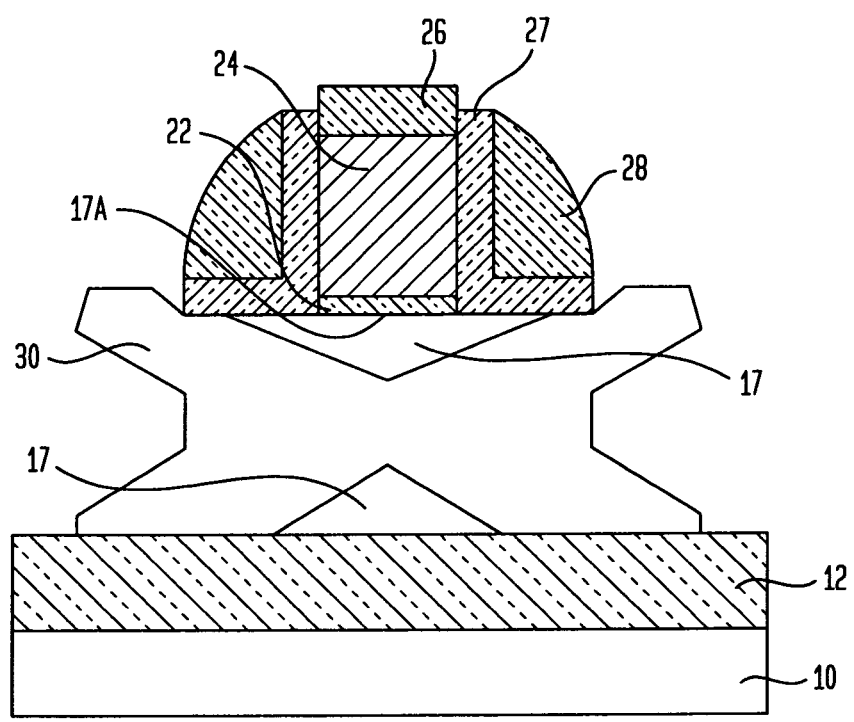

FIGS. 24-26 illustrate exemplary processing steps for forming an FET device with a channel region located in a semiconductor device structure that contains a floating semiconductor body, according to one embodiment of the present invention.

Figure 24A:
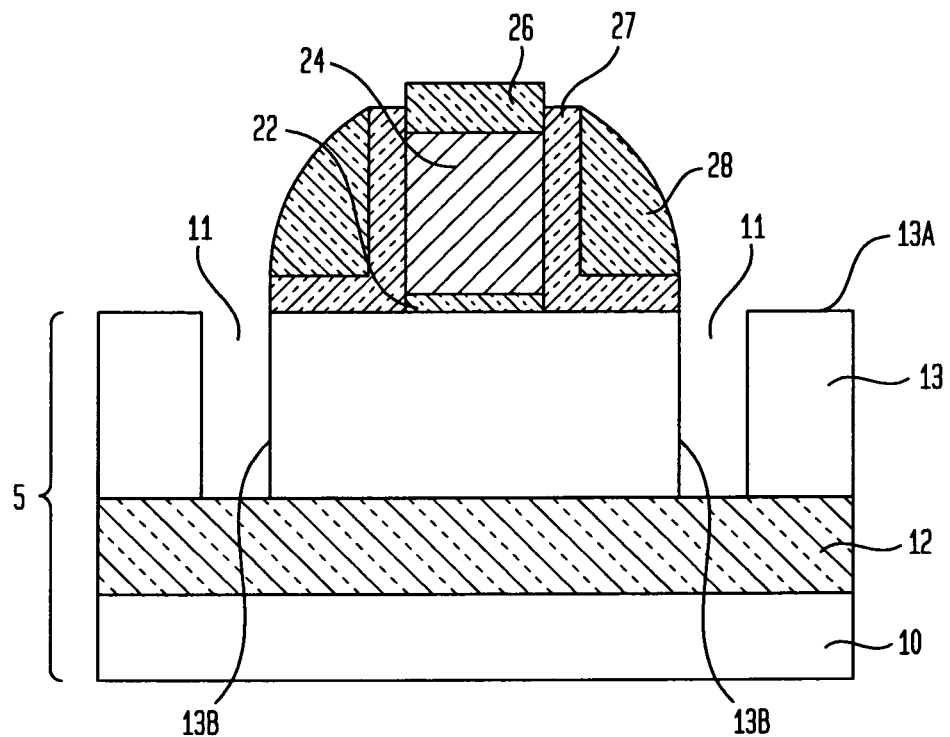
FIGS. 24-26 illustrate exemplary processing steps for forming an FET device with a channel region located in a semiconductor device structure that contains a floating semiconductor body with acute angles formed between a top surface and sidewall surfaces of the floating semiconductor body, according to one embodiment of the present invention.
Figure 24B:
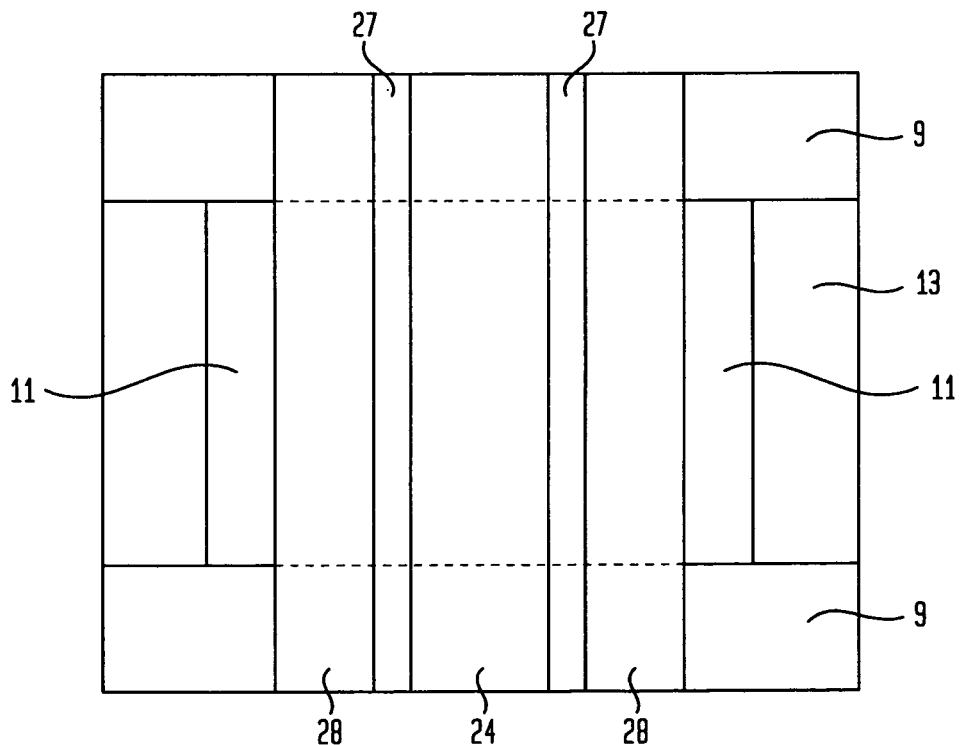

Specifically, a patterned gate stack, which comprises a gate dielectric layer 22, a gate conductor layer 24, a dielectric cap layer 26, and optional spacers 27 and 28, is formed over a substrate structure 5, which preferably has a semiconductor-on-insulator (SOI) configuration and comprises a base semiconductor substrate 10, an insulator layer 12, and a semiconductor device layer 13. The semiconductor device layer 13 has an upper surface 13A, and an anisotropic etching step is carried out to form trenches 11 with exposed trench sidewalls 13B in the bulk semiconductor substrate structure 13, as shown in FIG. 24A. FIG. 24B shows a top view of the structure shown by FIG. 24A. Specifically, the patterned gate stack extends beyond the active region defined by the semiconductor device layer 13 to the adjacent isolation regions 9.

The adjacent isolation regions 9 provide the necessary structural support for the gate stack, so that the semiconductor device layer 13 can be crystallographically etched to form a semiconductor device structure 17 that comprises a floating upper portion directly underneath the gate stack and a lower portion that is located over the insulator layer 12 but is disconnected from the floating upper portion, as shown in FIG. 25A. The floating upper portion of the semiconductor device structure 17 has an upper surface 17A and sidewall surfaces 17B, while acute angles are formed between the upper surface 17A and the sidewall surfaces 17B. FIG. 25B shows a top view of the structure of FIG. 24A. The floating upper portion of the semiconductor device structure 17 is visible through the gate stack in FIG. 25B. Pseudomorphic growth of stressor structures 30 over the sidewall surfaces 17B of the semiconductor device structure 17 of FIG. 25A will form the FET device as shown in FIG. 26.

Note that while FIGS. 5-26 illustratively demonstrate exemplary CMOS device structures and processing steps according to specific embodiments of the present invention, it is clear that a person ordinarily skilled in the art can readily modify such device structures and processing steps for adaptation to specific application requirements, consistent with the above descriptions. For example, while the semiconductor substrates shown in FIGS. 5-26 illustrate semiconductor substrates with upper surfaces oriented along the {110} or {100} crystal planes of single crystal silicon, other suitable crystal planes, such as the {111}, {211}, {311}, {511}, and {711} planes of single crystal silicon, can also be used in the semiconductor substrates of the present invention. Moreover, other single crystal semiconductor substrate materials with non-cubic unit cells, such as single crystal gallium nitride having hexagonal unit cells, can also be used for fabricating the CMOS devices of the present invention. A person ordinarily skilled in the art can readily modify the device structures and processing steps illustrated in FIGS. 5-26 for adaptation to other substrate structures, crystal orientations, or semiconductor materials, consistent with the spirit and principles of the present invention.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A semiconductor device comprising:
   a p-type field effect transistor (FET) having a channel region located in a semiconductor device structure, said semiconductor device structure having a top surface that is oriented along one of a first set of equivalent crystal planes and one or more additional surfaces that are oriented along a second, different set of equivalent crystal planes, said one or more additional surfaces form acute angles with the top surface of the semiconductor device structure; and
   one or more stressor layers adjacent to the channel region of the p-type FET and adjacent to said one or more additional surfaces of the semiconductor device structure, said one or more stressor layers are arranged and constructed to apply compressive stress to the channel region of the p-type FET, and have a lattice constant smaller than that of the semiconductor device structure, wherein a tensile stress is created in the stressor layers.

2. The semiconductor device of claim 1, wherein the semiconductor device structure comprises single crystal silicon, and the first and second sets of equivalent crystal planes are selected from the group consisting of the {100}, {110}, and {111} planes of silicon.

3. The semiconductor device of claim 1, wherein the semiconductor device structure is located over a substrate that comprises at least one insulator layer with a base semiconductor substrate layer thereunder, forming a semiconductor-on-insulator (SOI) structure.

4. The semiconductor device of claim 1, wherein the semiconductor device structure is located in a bulk semiconductor substrate structure.

5. The semiconductor device of claim 1, wherein the one or more stressor layers are comprised of Si:C and the channel region located in the semiconductor device structure is composed of silicon, silicon germanium or a combination thereof.

6. The semiconductor device of claim 1, wherein the p-type field effect transistor (FET) comprises a gate dielectric comprised of $SiO_2$, $HfO_2$, $ZrO_2$, $Al_2O_3$, $TiO_2$, $La_2O_3$, $SrTiO_3$, $LaAlO_3$ or mixtures thereof.

7. The semiconductor device of claim 1, wherein the p-type field effect transistor (FET) comprises a gate conductor comprised of polysilicon.

8. The semiconductor device of claim 1, wherein the semiconductor device structure is present on an upper semiconductor layer of an SOI substrate.

9. The semiconductor device of claim 8, where the upper semiconductor layer comprises a single crystal semiconductor material selected from the group consisting of Si, SiC, SiGe, SiGeC, Ge alloys, GaAs, InAs, InP, III-V compound semiconductors, II-VI compound semiconductors and combinations thereof.

10. A semiconductor device comprising:
    a p-channel field effect transistor (p-FET) having a p-doped channel region located in a semiconductor device structure, said semiconductor device structure having a top surface that is oriented along one of a first set of equivalent crystal planes and one or more additional surfaces that are oriented along a second, different set of equivalent crystal planes, wherein the one or more additional surfaces form acute angles with the top surface of the semiconductor device structure, wherein the semiconductor device structure comprises single crystal silicon, and the first and second sets of equivalent crystal planes are selected from the group consisting of the {100}, {110}, and {111} planes of silicon; and
    one or more stressor layers adjacent to said one or more additional surfaces of the semiconductor device structure and adjacent to the p-doped channel region of the p-FET to apply compressive stress to the p-doped channel region of the p-FET, wherein the one or more stressor layers have a lattice constant smaller than that of the semiconductor device structure, wherein a tensile stress is created in the stressor layers.

* * * * *